US011043532B2

(12) United States Patent
Yokoyama et al.

(10) Patent No.: US 11,043,532 B2
(45) Date of Patent: Jun. 22, 2021

(54) SEMICONDUCTOR DEVICE

(71) Applicant: SONY SEMICONDUCTOR SOLUTIONS CORPORATION, Kanagawa (JP)

(72) Inventors: Takashi Yokoyama, Kanagawa (JP); Taku Umebayashi, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/477,262

(22) PCT Filed: Dec. 13, 2017

(86) PCT No.: PCT/JP2017/044687
§ 371 (c)(1),
(2) Date: Jul. 11, 2019

(87) PCT Pub. No.: WO2018/135194
PCT Pub. Date: Jul. 26, 2018

(65) Prior Publication Data
US 2019/0363129 A1 Nov. 28, 2019

(30) Foreign Application Priority Data

Jan. 20, 2017 (JP) .............................. JP2017-008899

(51) Int. Cl.
*G11C 5/06* (2006.01)
*H01L 27/22* (2006.01)
(Continued)

(52) U.S. Cl.
CPC .............. *H01L 27/228* (2013.01); *G11C 5/02* (2013.01); *G11C 5/06* (2013.01); *H01L 25/0657* (2013.01);
(Continued)

(58) Field of Classification Search
USPC .......................................................... 365/63
See application file for complete search history.

(56) References Cited

U.S. PATENT DOCUMENTS 5,915,167 A * 6/1999 Leedy ...................... G11C 5/02
257/E21.597
6,597,062 B1 * 7/2003 Li ........................... G11C 5/063
257/686
(Continued)

FOREIGN PATENT DOCUMENTS

| JP | 2008-048313 | 2/2008 |
|----|-------------|--------|
| JP | 2010-171166 | 8/2010 |

(Continued)

OTHER PUBLICATIONS

David Schor, "Sony's 3-layer stacked CMOS image sensor technology", Feb. 3, 2018, IEDM 2017: WikiChip Fuse news. Web page=https://fuse.wikichip.org/news/763/iedm-2017-sonys-3-layer-stacked-cmos-image-sensor-technology/.*

(Continued)

*Primary Examiner* — Viet Q Nguyen
(74) *Attorney, Agent, or Firm* — Sheridan Ross P.C.

(57) ABSTRACT

A semiconductor device according to an embodiment of the present technology, and the semiconductor device includes: a first substrate provided with a memory array; and a second substrate that is stacked with the first substrate, and is provided with a peripheral circuit that controls operation of the memory array.

20 Claims, 17 Drawing Sheets

(51) Int. Cl.
*G11C 5/02* (2006.01)
*H01L 25/065* (2006.01)
*H01L 27/105* (2006.01)
*H01L 27/24* (2006.01)

(52) U.S. Cl.
CPC ........ *H01L 27/105* (2013.01); *H01L 27/2436* (2013.01)

(56) References Cited

U.S. PATENT DOCUMENTS

| | | | | |
|---|---|---|---|---|
| 7,067,373 | B2* | 6/2006 | Shukuri | B82Y 10/00 |
| | | | | 438/257 |
| 8,513,791 | B2* | 8/2013 | Bucki | H01L 25/0657 |
| | | | | 257/686 |
| 8,653,672 | B2* | 2/2014 | Leedy | H01L 25/0657 |
| | | | | 257/777 |
| 10,229,942 | B2* | 3/2019 | Oishi | H01L 27/1469 |
| 10,283,493 | B1* | 5/2019 | Nishida | H01L 27/11524 |
| 10,497,708 | B1* | 12/2019 | Chen | H01L 24/05 |
| 10,600,763 | B1* | 3/2020 | Xiao | H01L 24/08 |
| 10,636,813 | B1* | 4/2020 | Xiao | H01L 27/11582 |
| 2006/0134845 | A1* | 6/2006 | Pham | H01L 27/105 |
| | | | | 438/200 |
| 2007/0228383 | A1* | 10/2007 | Bernstein | H01L 21/6835 |
| | | | | 257/74 |
| 2007/0245068 | A1* | 10/2007 | Yero | G06F 12/0246 |
| | | | | 711/103 |
| 2008/0023747 | A1* | 1/2008 | Park | H01L 27/11526 |
| | | | | 257/314 |
| 2008/0042046 | A1 | 2/2008 | Mabuchi | |
| 2009/0057749 | A1* | 3/2009 | Gomikawa | H01L 27/11524 |
| | | | | 257/316 |
| 2009/0180339 | A1* | 7/2009 | Kim | G11C 29/808 |
| | | | | 365/200 |
| 2009/0182965 | A1* | 7/2009 | Norman | G11C 5/02 |
| | | | | 711/163 |
| 2009/0243115 | A1* | 10/2009 | Lee | H01L 23/49833 |
| | | | | 257/773 |
| 2009/0315095 | A1* | 12/2009 | Kim | H01L 21/823456 |
| | | | | 257/314 |
| 2010/0109138 | A1* | 5/2010 | Cho | H01L 25/18 |
| | | | | 257/686 |
| 2010/0181547 | A1 | 7/2010 | Kuroda | |
| 2010/0252894 | A1* | 10/2010 | Shim | H01L 27/115 |
| | | | | 257/379 |
| 2010/0327453 | A1* | 12/2010 | Kim | H01L 27/11526 |
| | | | | 257/773 |
| 2012/0032250 | A1* | 2/2012 | Son | H01L 29/42348 |
| | | | | 257/324 |
| 2012/0063209 | A1 | 3/2012 | Koyama et al. | |
| 2012/0217332 | A1* | 8/2012 | Sim | B02C 19/22 |
| | | | | 241/260.1 |
| 2012/0267689 | A1* | 10/2012 | Chen | H01L 27/0207 |
| | | | | 257/203 |
| 2013/0062682 | A1 | 3/2013 | Endo et al. | |
| 2013/0148411 | A1 | 6/2013 | Atsumi et al. | |
| 2014/0061750 | A1* | 3/2014 | Kwon | G11C 5/025 |
| | | | | 257/314 |
| 2014/0211056 | A1* | 7/2014 | Fan | H01L 27/1464 |
| | | | | 348/308 |
| 2014/0332749 | A1 | 11/2014 | Yokoyama | |
| 2015/0249096 | A1* | 9/2015 | Lupino | G11C 5/02 |
| | | | | 257/203 |
| 2016/0064041 | A1* | 3/2016 | Okada | H01L 27/11573 |
| | | | | 365/51 |
| 2016/0267972 | A1* | 9/2016 | Tanaka | H01L 27/249 |
| 2016/0343450 | A1* | 11/2016 | Lee | H01L 27/11556 |
| 2017/0256558 | A1* | 9/2017 | Zhang | H01L 27/1207 |
| 2017/0317061 | A1 | 11/2017 | Takahashi et al. | |
| 2018/0122825 | A1* | 5/2018 | Lupino | G11C 11/1675 |
| 2018/0196763 | A1* | 7/2018 | Fahmy | G06F 13/1668 |
| 2018/0240797 | A1* | 8/2018 | Yokoyama | H01L 21/823475 |
| 2019/0013326 | A1* | 1/2019 | Hua | H01L 27/11578 |
| 2019/0221557 | A1* | 7/2019 | Kim | H01L 25/50 |
| 2020/0099509 | A1* | 3/2020 | Sharma | H04L 9/0816 |

FOREIGN PATENT DOCUMENTS

| | | |
|---|---|---|
| JP | 2012-256822 | 12/2012 |
| JP | 2013-062420 | 4/2013 |
| JP | 2013-093371 | 5/2013 |
| JP | 2013-168631 | 8/2013 |
| JP | 20 14-220376 | 11/2014 |
| WO | WO 2016/098691 | 6/2016 |
| WO | WO 2016/185901 | 11/2016 |

OTHER PUBLICATIONS

International Search Report prepared by the Japan Patent Office dated Feb. 27, 2018, for International Application No. PCT/JP2017/044687.

* cited by examiner

SEMICONDUCTOR DEVICE

CROSS REFERENCE TO RELATED APPLICATIONS

This application is a national stage application under 35 U.S.C. 371 and claims the benefit of PCT Application No. PCT/JP2017/044687 having an international filing date of 13 Dec. 2017, which designated the United States, which PCT application claimed the benefit of Japanese Patent Application No. 2017-008899 filed 20 Jan. 2017, the entire disclosures of each of which are incorporated herein by reference.

TECHNICAL FIELD

The present technology relates to a semiconductor device that includes, for example, memory elements.

BACKGROUND ART

A memory chip or a memory-functional block that is provided on a semiconductor device having a memory function is broadly divided into a memory array section in which memory elements are disposed in an array form, and a peripheral circuit section that serves to gain access to a memory array. The peripheral circuit section occupies a large area in a chip, which causes a significant issue in reduction in mounting area.

To deal with such an issue, for example, PTL 1 discloses a semiconductor device in which the peripheral circuit section is provided on a front side of a substrate and the memory elements are provided on a back side of the substrate.

CITATION LIST

Patent Literature

PTL 1: Japanese Unexamined Patent Application Publication No. 2014-220376

SUMMARY OF THE INVENTION

As described above, it is desired to develop a semiconductor device that allows for reduction in mounting area.

It is desirable to provide a semiconductor device that allows for reduction in mounting area.

A semiconductor device according to an embodiment of the present technology includes: a first substrate provided with a memory array; and a second substrate that is stacked with the first substrate, and is provided with a peripheral circuit that controls operation of the memory array.

In the semiconductor device according to the embodiment of the present technology, the memory array and the peripheral circuit that controls the operation of the memory array are separately formed on the first substrate and the second substrate, respectively, these substrates are stacked. This allows for reduction in area of a substrate provided with the peripheral circuit.

According to the semiconductor device of the embodiment of the present technology, the memory array and the peripheral circuit that controls the operation of the memory array are separately disposed on the first substrate and the second substrate, respectively, which reduces an area of a substrate having the peripheral circuit. This allows for reduction in mounting area.

It is to be noted that effects of the present technology are not limited to the effects described above, and may include any of effects described below.

MODES FOR CARRYING OUT THE INVENTION

Hereinafter, some embodiments of the present disclosure will be described in detail with reference to the drawings. It is to be noted that description is given in the following order.
1. First Embodiment (a semiconductor device in which a memory array and a peripheral circuit are provided respectively on a first substrate and a second substrate, and the first and second substrates are stacked)
   1-1. Basic Configuration
   1-2. Configuration of Semiconductor Device
   1-3. Workings and Effects
2. Second Embodiment (a semiconductor device in which a plurality of memory arrays are provided on the first substrate)
3. Third Embodiment (a semiconductor device that adopts a three-layered structure achieved through stacking a substrate having a sensor)
4. Fourth Embodiment (a semiconductor device that adopts a four-layered structure achieved through separating the sensor for two substrates)
5. Modification Example 1 (an example where an extraction electrode is provided)
6. Modification Example 2 (an example where other types of memory elements are used)

1. First Embodiment (1-1. Basic Configuration)

Figure 1:
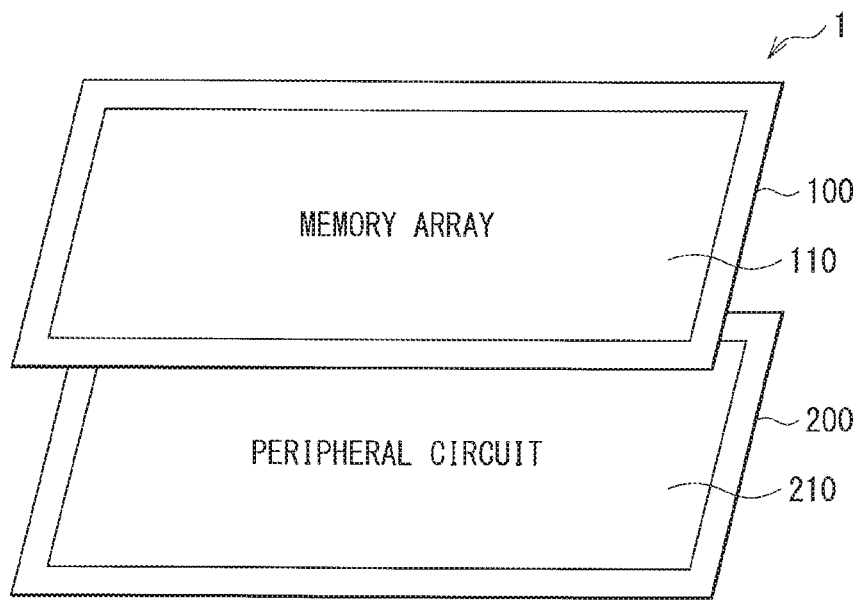
FIG. 1 is a schematic view of a semiconductor device according to a first embodiment of the present disclosure.

FIG. 1 illustrates a schematic configuration of a semiconductor device (a semiconductor device 1) according to a first embodiment of the present disclosure. The semiconductor device 1 is configured through stacking a first substrate 100 and a second substrate 200 that are electrically coupled to each other. The semiconductor device 1 of the present embodiment has a memory function, and has a configuration in which a memory array 110 is formed on the first substrate 100 and a peripheral circuit 210 that controls operation of a plurality of memory elements (memory elements 710, see FIG. 4) configuring the memory array 110 is formed on the second substrate 200.

Figure 2:
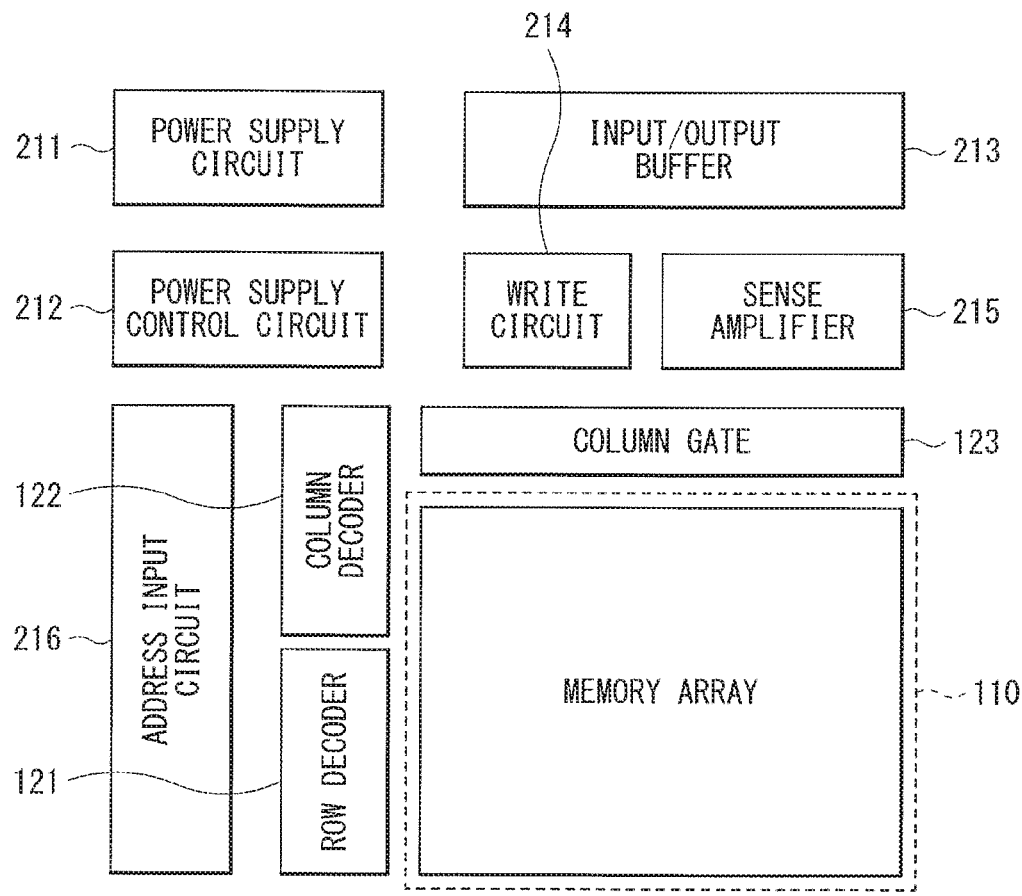
FIG. 2 is a block diagram illustrating a specific configuration of the semiconductor device illustrated in FIG. 1.

FIG. 2 is a block diagram illustrating an example of a specific configuration of the semiconductor device 1. In the semiconductor device 1 of the present embodiment, the first substrate 100 is provided with, for example, a row decoder 121, a column decoder 122, and a column gate 123 in addition to the memory array 110. The second substrate 200 is provided with, for example, a power supply circuit 211, a power supply control circuit 212, an input/output buffer 213, a write circuit 214, a sense amplifier 215, and an address input circuit 216. It is to be noted that the above-described allocation is illustrative only, and non-limiting. For example, the row decoder 121, the column decoder 122, and the column gate 123 may be provided on the second substrate 200. Alternatively, for example, the column decoder 122 may be separated to be formed on the first substrate 100 and the second substrate 200.

As a method of determining circuits to be provided on the first substrate 100 and the second substrate 200, for example, the circuits are preferably separated with reference to a drive voltage or power-supply decompression of a transistor included in each of the circuits. For example, on the first substrate 100, a circuit including a transistor having a lowest drive voltage is preferably mounted. On the second substrate 200, for example, a circuit including a transistor having a highest drive voltage is preferably mounted. Here, examples of a transistor having a low drive voltage include a transistor in a 22 nm-generation and beyond, and more preferably include a transistor in a 14 nm-generation and beyond. Here, "nm-generation" initially indicates a minimum size of a portion, such as a gate length, that is difficult to be processed. At present, however, the "nm-generation" does not indicate a size of a specific portion, and the size is reduced by a factor of about 0.7 in every new generation.

As will hereinafter be described in detail, examples of a transistor provided on the first substrate 100 include a transistor employing a high-dielectric film/metal gate (High-K/Metal Gate) technology, and a transistor having a three-dimensional structure. Examples of the transistor of the three-dimensional structure include an FD-SOI transistor, a Fin field-effect transistor (Fin-FET), a Tri-Gate transistor, a nanowire (Nano-Wire) transistor, a T-FET, etc. For each of these transistors, it is possible to use, as semiconductor materials, an inorganic semiconductor such as Ge, and a compound semiconductor including, for example, a III-V group semiconductor, a II-VI group semiconductor, etc., in addition to Si. Specifically, InGaAs, InGaSb, SiGe, GaAsSb, InAs, InSb, InGanZnO (IGZO), $MoS_2$, $WS_2$, Boron Nitride, and Silicane Germanene are used. Another example of the transistor include a graphene transistor using a graphene.

Figure 3:
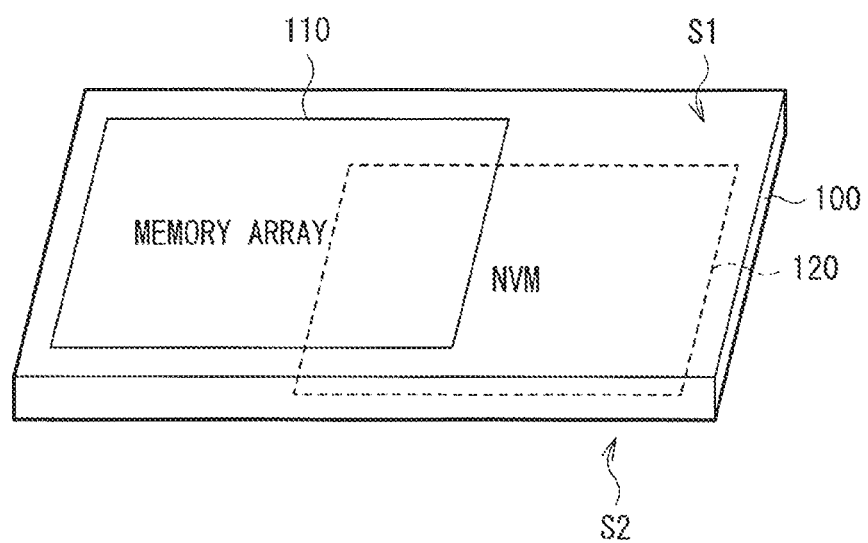
FIG. 3 is a schematic view describing a configuration of a first substrate.

It is to be noted that the transistor provided on the first substrate 100 is preferably provided on an opposite surface (surface S2) side of the second substrate 200. In other words, on the first substrate 100, as illustrated in FIG. 3, the memory array 110 including a plurality of the memory elements 710 is preferably provided on a surface S1 side, and a circuit (for example, NVM 120) including a transistor corresponding to each of memory elements is preferably provided on the surface S2 side.

A transistor provided on the second substrate 200 is preferably, for example, a transistor in a generation earlier than the 22 nm-generation, and examples of the transistor include a transistor in a 40 nm-generation. Specifically, such a transistor is typically a planar transistor using an Si substrate. Examples of the peripheral circuit 210 include a logic circuit, and thrilling the peripheral circuit 210 with use of a transistor in an earlier generation makes it possible to achieve cost reduction. However, a transistor mounted on the second substrate 200 is not necessarily the transistor in the earlier generation. For example, use of a leading-edge transistor in the 22 nm generation or beyond that is cited as a transistor provided on the first substrate 100 makes it possible to increase speed of signal processing in the peripheral circuit. It is to be noted that, in a case where a portion of the peripheral circuit is formed with use of a leading-edge transistor as described above, such a circuit portion may be provided on the first substrate 100. This leads to further reduction in a mounting area of the peripheral circuit, which makes it possible to mount other circuits (for example, an analog circuit including an analog element) on the second substrate 200.

It is to be noted that, in some cases, the semiconductor device 1 incorporates, for example, a signal processing circuit, etc. such as a CPU and a GPU as circuits other than the memory array 110 and the peripheral circuit 210 thereof. In such a case, it is sufficient if the above-described signal processing circuit, etc. are provided separately as appropriate on the first substrate 100 or the second substrate 200 depending on, for example, generations of transistors included in the signal processing circuit, etc. as described above.

(1-2. Configuration of Semiconductor Device)

Figure 4:
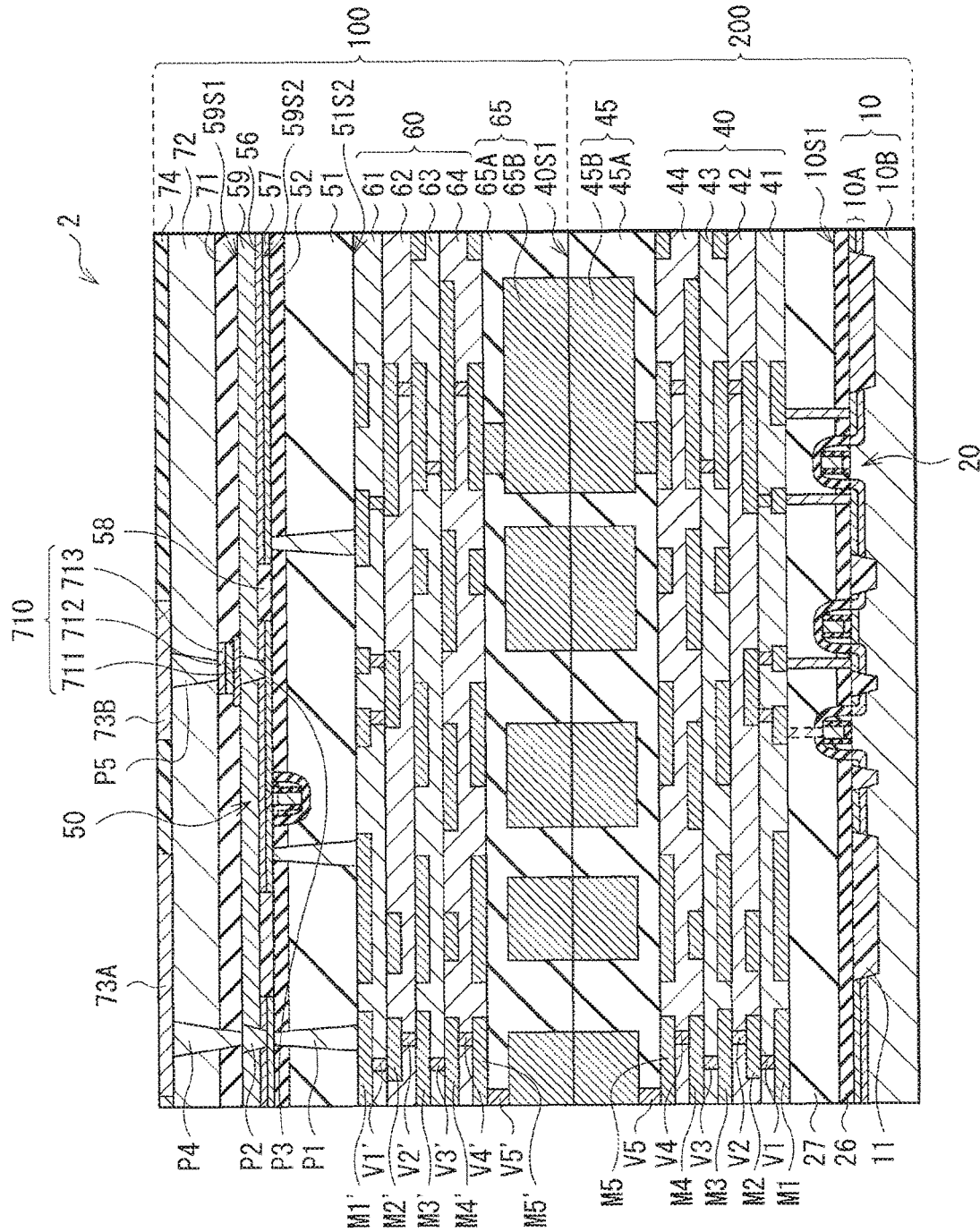
FIG. 4 is a cross-sectional view of an example of a configuration of the semiconductor device illustrated in FIG. 1.

FIG. 4 illustrates an example of a specific cross-sectional configuration of the semiconductor device 1 illustrated in FIG. 1. In the semiconductor device 1, the first substrate 100 is provided with the memory element 710 on a surface (a surface 59S1) of an interlayer insulating layer 59. Examples of the memory element 710 include a magnetic tunnel junction (Magnetic Tunnel Junction: MTJ) element. The memory element 710 is configured through stacking, for example, a conductive film 711 serving as a bottom electrode, a storage section 712, and a conductive film 713 serving as a top electrode (also serving as a bit line BL) in this order on the interlayer insulating layer 59, for example. The conductive film 711 is coupled to a source region 57S or a drain region 57D of a transistor 50 through, for example, a contact plug P3 (for example, see FIG. 6). The contact plug P3 has, for example, a truncated pyramid shape or a truncated cone shape, and herein, an occupied area thereof becomes smaller from a surface 59S1 side toward a surface 59S2 side of the interlayer insulating layer 59 (in other words, from an upper end toward a lower end). The contact plug P3 includes a material using, as a main constituent, a low-resistance metal such as Cu (copper), W (tungsten), or aluminum (Al), for example. Further, around such a low-resistance metal, a barrier metal layer may be provided that includes a simple substance or an alloy, etc. of Ti (titanium) or Ta (tantalum). An insulating layer 71 is provided around the conductive film 711, the storage section 712, and the conductive film 713. The insulating layer 71 includes, for example, a High-K (high-dielectric) film that is formable at a low temperature, that is, Hf oxide, $Al_2O_3$. Ru (ruthenium) oxide, Ta oxide, an oxide including Al, Ru, Ta, or Hf and Si, a nitride including Al, Ru, Ta, or Hf and Si, an oxynitride including Al, Ru, Ta, or Hf and Si, or the like.

The storage section 712 in the memory element 710 is preferably, for example, a spin injection magnetization reversal storage element (STT-MTJ: Spin Transfer Torque-Magnetic Tunnel Junctions) that stores information through reversing a magnetization direction of a storage layer (a storage layer 712D) to be described later by spin injection. The STT-MTJ enables high-speed writing/reading, and is therefore promising as a non-volatile memory that is an alternative to a volatile memory.

Each of the conductive film 711 and the conductive film 713 includes a metallic film including, for example, Cu, Ti, W, Ru, etc. Each of the conductive film 711 and the conductive film 713 preferably includes a metallic film including a material other than a constituent material of a base layer 712A or a cap layer 712E to be described later, that is, mainly a Cu film, an Al film, or a W film. Further, it is also possible to configure each of the conductive film 711 and the conductive film 713 as a metallic film (a single-layer film) or a stacked film that includes Ti, TiN (titanium nitride), Ta, TaN (tantalum nitride), W, Cu, or Al.

Figure 5:
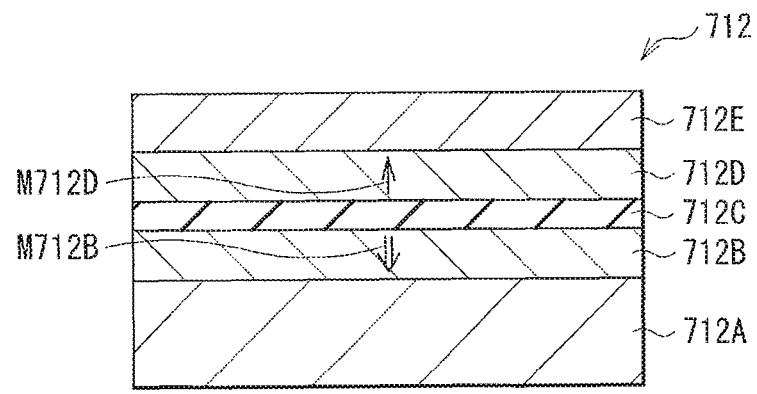
FIG. 5 is a cross-sectional view of a configuration of a storage section of a storage element provided on the first substrate of the semiconductor device illustrated in FIG. 4.

FIG. 5 illustrates an example of a configuration of the storage section 712. The storage section 712 has a configuration in which, for example, the base layer 712A, a magnetization fixed layer 712B, an insulating layer 712C, the storage layer 712D, and the cap layer 712E are stacked in order from a side closer to the conductive film 711. In other words, the memory element 710 has a bottom pin structure having the magnetization fixed layer 712B, the insulating layer 712C, and the storage layer 712D in this order from bottom (a topside of the interlayer insulating layer 59 in FIG. 3) to top of a stacking direction. Information storage is achieved through changing a direction of magnetization M712D of the storage layer 712D having uniaxial anisotropy. In accordance with a relative angle (parallel or anti-parallel) between the magnetization M712D of the storage layer 712D and magnetization M712B of the magnetization fixed layer 712B, "0" or "1" of information is specified.

Each of the base layer 712A and the cap layer 712E includes a metallic film (a single-layer film) or a stacked film that includes Ta, Ru, etc.

The magnetization fixed layer 712B is a reference layer acting as a reference for storage information (a magnetization direction) of the storage layer 712D, and includes a ferromagnetic material having a magnetic moment in which a direction of the magnetization M712B is fixed to a direction perpendicular to a film surface. The magnetization fixed layer 712B includes, for example, Co—Fe—B.

It is not desirable that the direction of the magnetization M712B of the magnetization fixed layer 712B vary depending on writing or reading: however, it is not always necessary for the direction of the magnetization M712B of the magnetization fixed layer 712B to be fixed to a specific direction. The reason for this is that it is sufficient to make the direction of the magnetization M712B of the magnetization fixed layer 712B more difficult to move than the direction of the magnetization M712D of the storage layer 712D. For example, it is sufficient if the magnetization fixed layer 712B has a greater coercive force, a larger magnetic film thickness, or a greater magnetic damping constant as compared with the storage layer 712D. To fix the direction of the magnetization M712B, it is sufficient if an antiferromagnetic material such as PtMn or IrMn, for example, is provided in contact with the magnetization fixed layer 712B. As an alternative, the direction of the magnetization M712B may be fixed indirectly through magnetically coupling a magnetic material brought into contact with such an antiferromagnetic material with the magnetization fixed layer 712B with a non-magnetic material such as Ru interposed therebetween.

The insulating layer 712C is an intermediate layer acting as a tunnel barrier layer (a tunnel insulating layer), and includes, for example, aluminum oxide or magnesium oxide (MgO). Above all, the insulating layer 712C preferably includes magnesium oxide. This allows for an increase in a magnetic resistance change rate (an MR ratio), thereby making it possible to improve spin injection efficiency and reduce a current density for reversing the direction of the magnetization M712D of the storage layer 712D.

The storage layer 712D includes a ferromagnetic material having a magnetic moment in which the direction of the magnetization M712D varies freely in a direction perpendicular to a film surface. The storage layer 712D includes, for example, Co—Fe—B.

It is to be noted that, in the present embodiment, description is provided through exemplifying the MTJ element as the memory element 710; however, another non-volatile element may be also applicable. Example of such a non-volatile element include a resistance variable element such as, for example, an ReRAM or a FLASH to be described later in addition to the MTJ element. Further, such an element may be, for example, a volatile element such as a DRAM (Dynamic Random Access Memory) to be described later.

An insulating layer 72 is provided on the memory element 710 and the insulating layer 71. The insulating layer 72 includes, for example, an $SiO_2$ Low-K (low-dielectric) film. A wiring line 73A and a wiring line 73B each of which includes, for example, Cu, Al, etc. are provided on the insulating layer 72, and an insulating film 74 that includes, for example, $SuO_2$ is provided around such wiring lines. The wiring line 73A is coupled to a metallic film M1 to be described later through contact plugs P1, P2, and P4, for example. The wiring line 73B is coupled to a top electrode (the conductive film 713) of the memory element 710 through a contact plug P5, for example.

A transistor 50 configuring the NVM 120 is provided on another surface (the surface 59S2) of the interlayer insulating layer 59. The transistor 50 is a transistor having a low drive voltage as described above, and is, for example, a transistor having a three-dimensional structure. Around the transistor 50, a plurality of the contact plugs P1 is provided that electrically couples a silicide layer 57 and a metallic film M1' of a multi-layer wiring formation section 60 to be described later. On the silicide layer 57 and an insulating layer 56 between the transistor 50 and each of the contact plugs P1, an element separating film 58 that is formed using, for example, STI (Shallow Trench Isolation) is provided as appropriate. The element separating film 58 includes, for example, a silicon oxide film ($SiO_2$).

Figure 6:
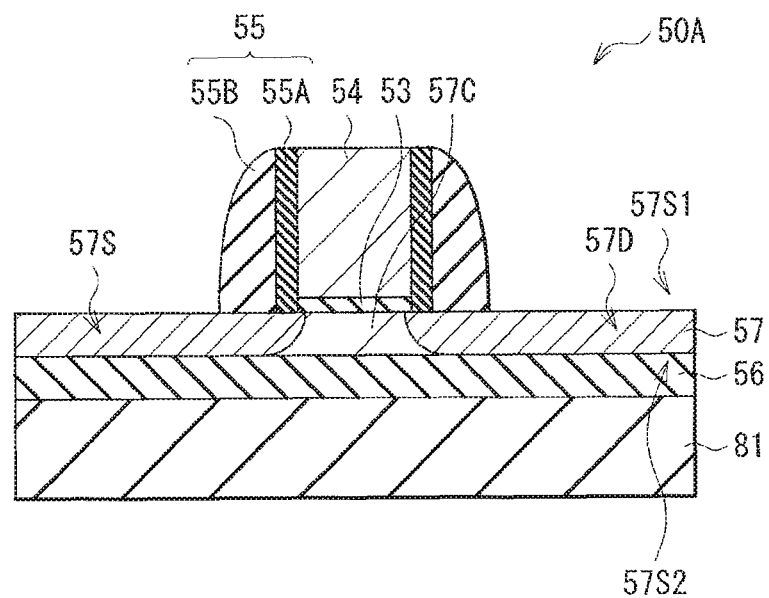
FIG. 6 is a cross-sectional view of an example of a configuration of a transistor provided on a side on which the first substrate illustrated in FIG. 4 is located.

FIG. 6 illustrates a cross-sectional configuration of a fully depleted silicon-on-insulator (FD-SOI) transistor 50A as an example of the transistor 50. The FD-SOI transistor 50A has a planar transistor structure. In the FD-SOI transistor 50A, the insulating layer 56 serving as a Box layer and the silicide layer 57 are stacked in this order on a semiconductor substrate 81 (a core substrate), and the FD-SOI transistor 50A has a gate electrode 54 on a principal surface (a surface 57S1) of the silicide layer 57. Note that a gate insulating film 53 that includes a silicon oxide film, etc. is provided between the gate electrode 54 and the silicide layer 57. On a side surface of the gate electrode 54, a side wall 55 is provided that includes a stacked film of a silicon oxide film 55A and a silicon nitride film 55B, for example.

The silicide layer 57 is provided with the channel region 57C, the source region 57S, and the drain region 57D. The insulating layer 56 called the Box layer is provided between the semiconductor substrate 81 and the silicide layer 57. In the ED-SOI transistor 50A, the silicide layer 57 has an extremely small thickness of, for example, 10 nm or less, and eliminates a need for channel doping, which allows the FD-SOI transistor 50A to be configured as a fully depleted type.

Figure 7:
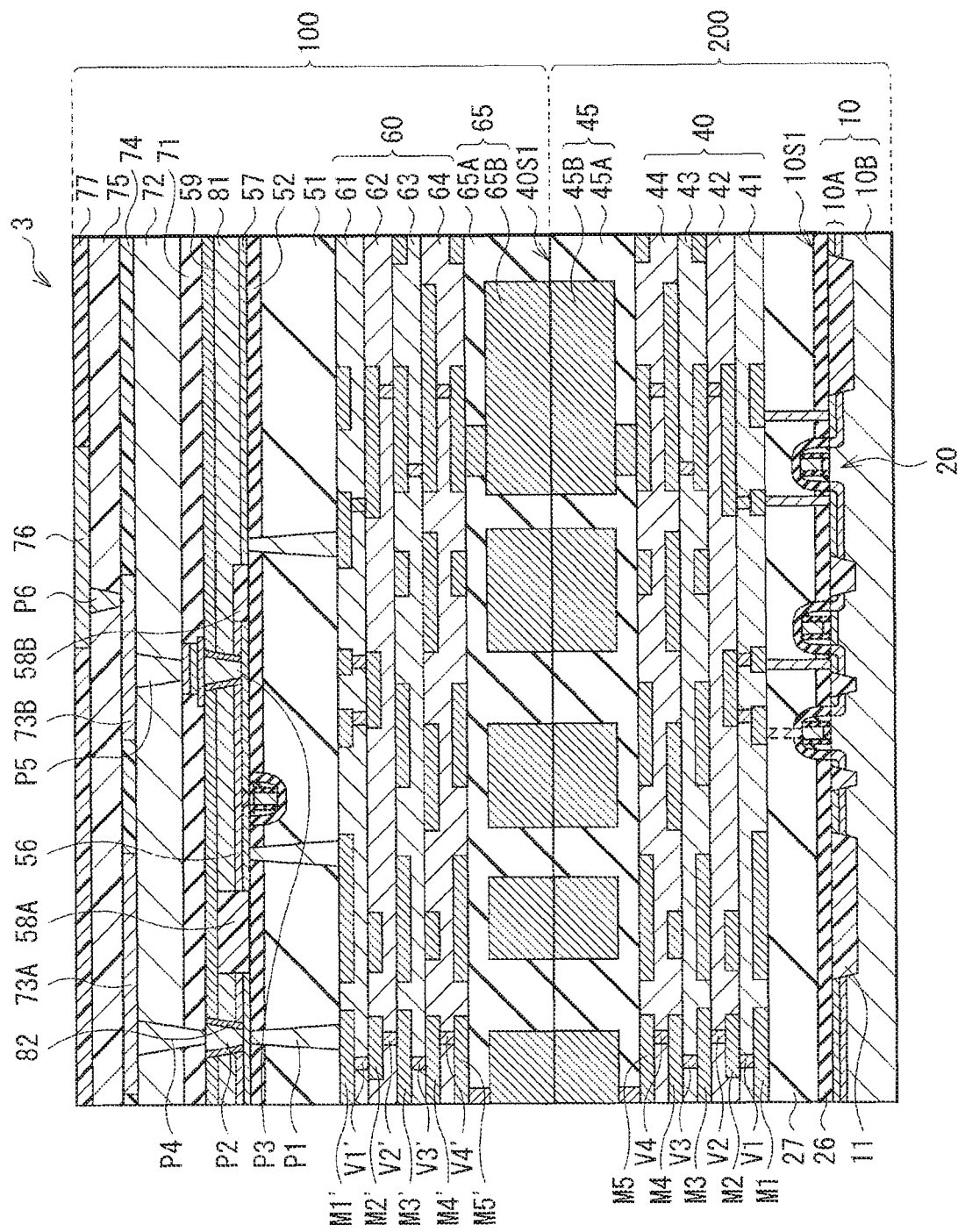
FIG. 7 is a cross-sectional view of another example of a configuration of the semiconductor device illustrated in FIG. 1.

It is to be noted that FIG. 3 represents a configuration in which the semiconductor substrate 81 illustrated in FIG. 6 is completely removed by polishing, and the interlayer insulating layer 59 is provided directly on the Box layer (the insulating layer 56) of the transistor 50; however, the configuration is not limited thereto. For example, as illustrated in FIG. 7, a configuration in which the semiconductor substrate 81 remains may be adopted. However, as illustrated in FIG. 7, in a case where the element separating film 58 is exposed on a surface of the semiconductor substrate 81 by polishing (for example, an element separating film 58A), this makes it difficult to control a potential of the semiconductor substrate 81. In such a case, a thickness of the element separating film 58 in the vicinity of a tap portion (a portion in contact with the memory element 710) is preferably reduced, like the element separating film 58 in FIG. 7. Further, in a case where the semiconductor substrate 81 remains, an insulating film 82 is preferably provided around the contact plugs P2 and P3 that penetrate through the semiconductor substrate 81, as illustrated in FIG. 7. This electrically isolates the contact plugs P2 and P3 from the semiconductor substrate 81.

Further, in FIG. 7, a conductive film 76 is provided on the wiring lines 73A and 73B and the insulating film 74 with an insulating layer 75 interposed therebetween. An insulating film 77 is provided around the conductive film 76, and the wiring line 73B and the conductive film 76 are coupled to each other through a contact plug P6.

Figure 8A:
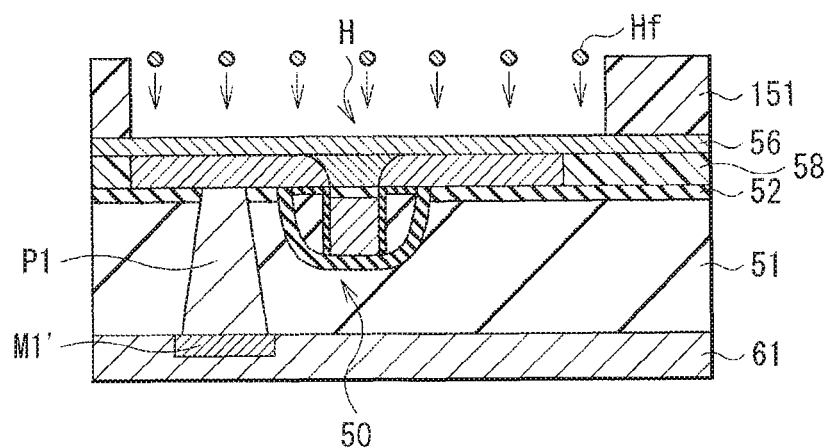
FIG. 8A is a cross-sectional view describing a manufacturing method of another configuration of the semiconductor device illustrated in FIG. 4.
Figure 8B:
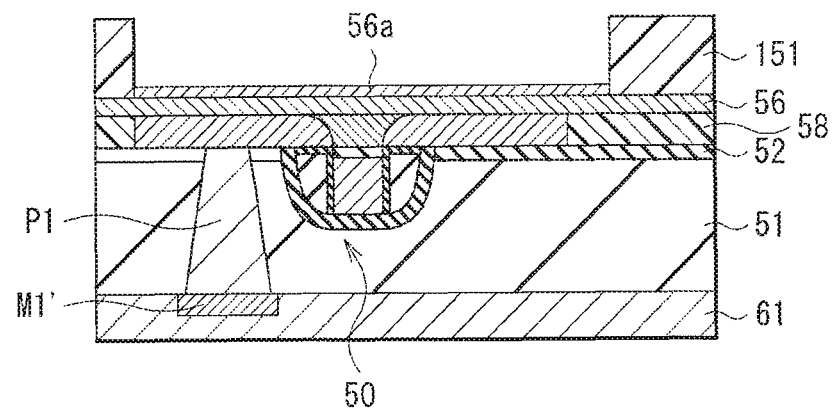
FIG. 8B is a cross-sectional view of a process following the process illustrated in FIG. 8A.
Figure 8C:
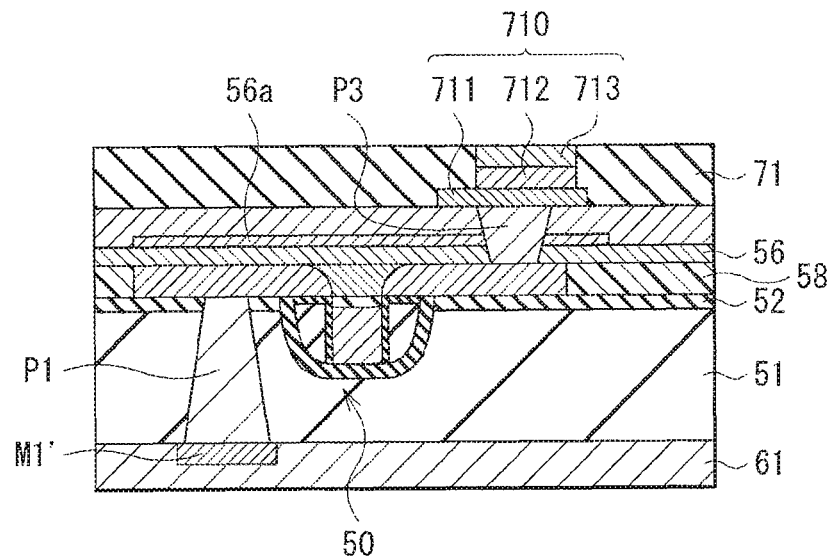
FIG. 8C is a cross-sectional view of a process following the process illustrated in FIG. 8B.

It is to be noted that, in a case where the semiconductor substrate 81 is completely removed by polishing as illustrated in FIG. 4, there is a possibility that a threshold voltage (Vth) of the transistor 50 becomes uncontrollable by a back-bias control. In such a case, a film including a material allowing for control of a work function of a semiconductor material (for example, a small amount of a High-K film (a High-K film 56a)) is preferably formed on the insulating layer 56 acting as the Box layer. This makes it possible to control the threshold voltage (Vth) of the transistor 50. FIGS. 8A to 8C illustrate a manufacturing method of the High-K film 56a in process order.

First, as illustrated in FIG. 8A, the semiconductor substrate 81 is polished to expose the insulating layer 56, and thereafter a resist film 151 is patterned on the insulating layer 56. Next, for example, hafnium (Hf) is sputtered inside an opening H that is formed by patterning. As a result, the High-K film 56a having a film thickness of, for example, 1 nm is formed inside the opening H, as illustrated in FIG. 8B. It is to be noted that FIG. 8B illustrates an example in which the High-K film 56a is formed on the insulating layer 56 inside the opening H; however, this is not limitative. Alternatively, a state in which Hf is doped on a surface of the insulating layer 56 inside the opening H may be adopted. Thereafter, as illustrated in FIG. 8C, after the resist film 151 is removed, the insulating layer 56, the contact plug P3, the insulating layer 71, and the memory element 710 are formed in this order.

Further, the transistor 50 is described with reference to the completely depleted FD-SOI transistor 50A as an example; however, the transistor 50 is not limited thereto. Examples of the transistor 50 include a Fin-FET transistor 50B (FIG. 9), a Tri-Gate transistor 50C (FIG. 10), a Nano-Wire transistor 50D (FIG. 11), and a Tunnel-FET (T-FET) 50E (FIG. 12).

Figure 9:
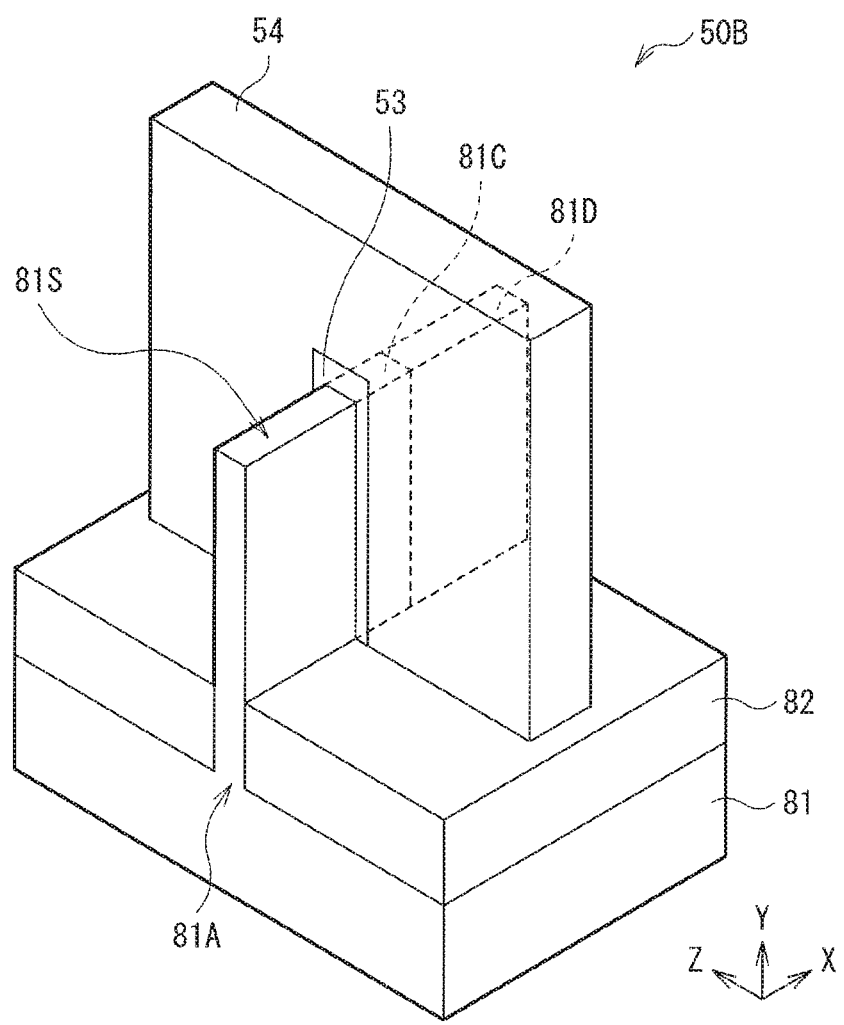
FIG. 9 is a cross-sectional view of another example of the configuration of the transistor provided on the side on which the first substrate illustrated in FIG. 4 is located.

FIG. 9 illustrates a configuration of the Fin-FET transistor 50B in perspective view. The Fin-FET transistor 50B includes, for example, a fin 81A including Si and having a source region 81S and a drain region 81D, the gate insulating film 53, and the gate electrode 54.

The fin 81A takes a flat-plate shape, and a plurality of fins 81A is provided upright on the semiconductor substrate 81 that includes, for example, Si. The plurality of the fins 81A each extends in an X direction, and is disposed side by side in a Y-axis direction, for example. The insulating film 82 that includes, for example, $SiO_2$ and buries a portion of the fin 81A therein is provided on the semiconductor substrate 81. Side surfaces and a top surface of the fin 81A that are exposed from the insulating film 82 are covered with the gate insulating film 53 that includes, for example, HfSiO, HfSiON, TaO, TaON, or the like. The gate electrode 54 extends in a Z direction intersecting with an extending direction (the X direction) of the fin 81A to stride across the fin 81A. On the fin 81A, a channel region 81C is formed at a portion intersecting with the gate electrode 54, and the source region 81S and the drain region 81D are formed on both ends between which the channel region 81C is interposed.

Figure 10:
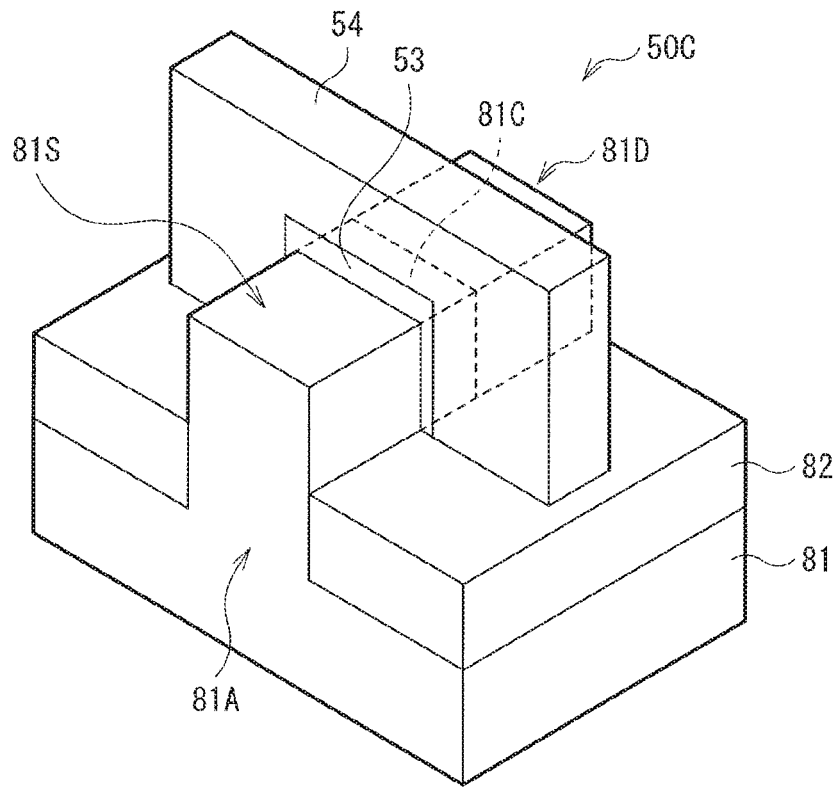
FIG. 10 is a cross-sectional view of another example of the configuration of the transistor provided on the side on which the first substrate illustrated in FIG. 4 is located.

FIG. 10 schematically illustrates a configuration of the Tri-Gate transistor 50C. As with the transistor 50 having the Fin-FET structure illustrated in FIG. 9, the Tri-Gate transistor 50C is provided with the fin 81A that includes Si and extends in one direction, and the gate electrode 54 that is substantially orthogonal to the fin 81A, and the gate insulating film 53 is provided between the gate electrode 54 and the fin 81A, like the Fin-FET. The gate electrode 54 surrounds both right and left side surfaces, and the top surface of the fin 81A, and each of the surfaces acts as a gate, as with the Fin-FET transistor 50B. On the fin 81A, the channel region 81C is formed in a portion intersecting with the gate electrode 54, and the source region 81S and the drain region 81D are formed on both ends between which the channel region 81C is interposed. It is to be noted that the Tri-Gate transistor 50C differs from the Fin-FET transistor 50B in that the top surface, in addition to the side surfaces of the fin 81A, also functions as a channel.

Figure 11:
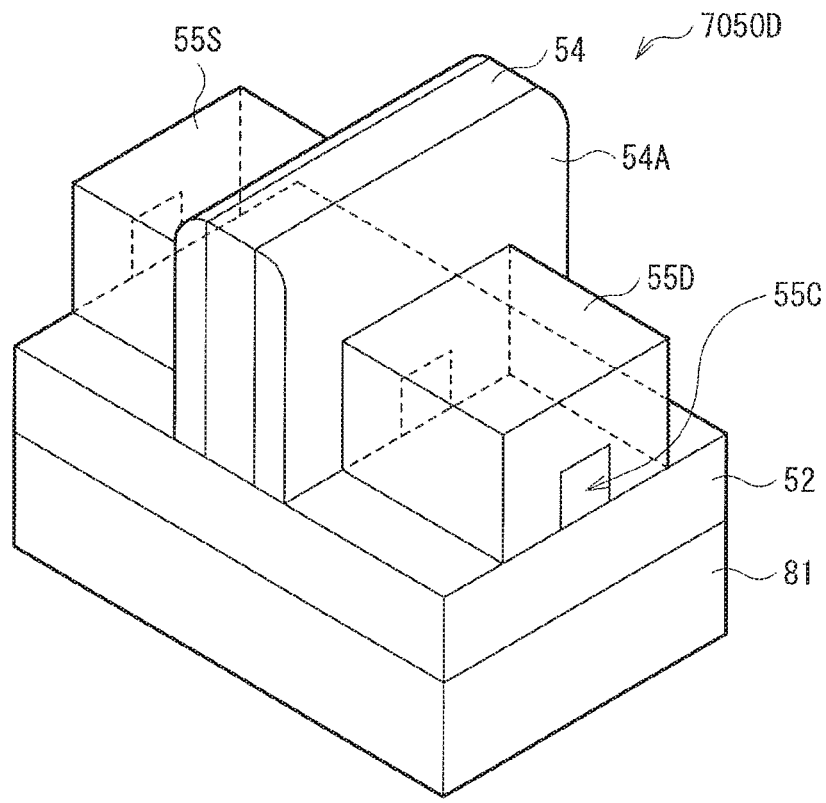
FIG. 11 is a cross-sectional view of another example of the configuration of the transistor provided on the side on which the first substrate illustrated in FIG. 4 is located.
Figure 12:
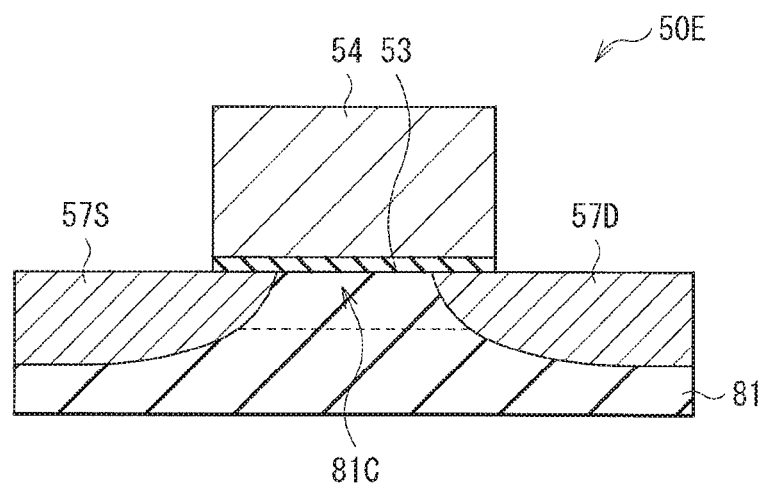
FIG. 12 is a cross-sectional view of another example of the configuration of the transistor provided on the side on which the first substrate illustrated in FIG. 4 is located.

FIG. 11 schematically illustrates a configuration of the Nano-Wire transistor 50D. As with the Fin-FET transistor 50B and the Tri-Gate transistor 50C, the Nano-Wire transistor 50D is a transistor having the three-dimensional structure. In the Nano-Wire transistor 50D, a silicon nanowire 55C through which an electric current flows is covered with the gate electrode 54, and a source region 55S and a drain region 55D are formed on both ends of the gate electrode 54 with a gate sidewall 54A interposed therebetween. In the Nano-Wire transistor 50D, right and left side surfaces and a top surface of the silicon nanowire 55C are covered with the gate electrode 54, which suppresses occurrence of an off-state current. Further, reduction in a diameter of the silicon nanowire 55C results in suppression of occurrence of a leakage current.

FIG. 12 illustrates a cross-sectional configuration of the tunnel field-effect transistor (T-FET) 50E. As with the FD-SOI transistor 50A, the T-FET 50E has a planar transistor structure, and is a transistor that performs on/off control utilizing an interband tunneling phenomenon of electrons. In the T-FET 70D, one of the source region 57S and the drain region 57D is formed using a p-type conductive semiconductor, and the other is formed using an n-type conductive semiconductor.

In addition to these transistors, for example, a transistor employing the high-dielectric film/metal gate (High-K/Metal Gate) technology may be used. The transistor employing the high-dielectric film/metal gate technology uses a high-dielectric material for a gate insulating film, and a low-resistance metal for a gate electrode. Examples of the high-dielectric material include hafnium oxide. A transistor having such a configuration makes it possible to reduce a gate leakage current while reducing a thickness of the gate insulating film.

The transistor 50 is buried by interlayer insulating films 51 and 52. The multi-layer wiring formation section 60 is provided on one surface (a surface 51S2) of the interlayer insulating film 51. The multi-layer wiring formation section 60 has a structure in which the metallic film M1', a metallic film M2', a metallic film M3', a metallic film M4', and a metallic film M5' each of which configures, for example, a word line, a bit line, a selective line, etc. are stacked on an interlayer insulating film 61, an interlayer insulating film 62, an interlayer insulating film 63, and an interlayer insulating film 64 that are stacked in order from a side closer to the transistor 50, for example. Here, the metallic film M1', the metallic film M2', the metallic film M3', the metallic film M4', and the metallic film M5' are buried in the interlayer insulating film 61, the interlayer insulating film 62, the interlayer insulating film 63, and the interlayer insulating film 64, respectively. Further, the metallic film M1' and the metallic film M2' are coupled to each other through a via V1' penetrating through the interlayer insulating film 61. Similarly, the metallic film M2' and the metallic film M3' are coupled to each other through a via V2' penetrating through the interlayer insulating film 62. The metallic film M3' and the metallic film M4' are coupled to each other through a via V3' penetrating through the interlayer insulating film 63. The metallic film M4' and the metallic film M5' are coupled to each other through a via V4' penetrating through the interlayer insulating film 64. It is to be noted that a configuration of the multi-layer wiring formation section 60 illustrated in FIG. 4 is represented as an example, and the configuration is not limited thereto.

A surface wiring formation section 65 that is surface-bonded to the second substrate 200 is provided on the multi-layer wiring formation section 60. In the surface wiring formation section 65, a metallic film 65B that includes, for example, copper (Cu) is buried in a surface of an insulating film 65A, and the metallic film 65B is coupled to the metallic film M5' of the multi-layer wiring formation section 60 through a via V5' penetrating through the insulating film 65A.

The second substrate 200 is configured through stacking, for example, multi-layer wiring formation section 40 and a surface wiring formation section 45 in this order on one surface (a surface 10S1) side of a semiconductor substrate 10. An Si planar transistor 20 is provided in the vicinity of the surface 10S1 of the semiconductor substrate 10. It is to be noted that FIG. 4 exemplifies a case where the three transistors 20 are provided; however, the number of the transistors 20 provided on the semiconductor substrate 10 is not limited specifically. The number may be one or two, or four or more. Further, as described above, any transistor other than the Si planar transistor may be provided.

An element separating film 11 that dudes, for example, STI is provided on the semiconductor substrate 10. The element separating film 11 is an insulating film that includes, for example, a silicon oxide film ($SiO_2$), and one surface thereof is exposed on the one surface (the surface 10S1) of the semiconductor substrate 10.

The semiconductor substrate 10 has a stacked structure of a semiconductor layer 10A and a semiconductor layer 10B. In the semiconductor layer 10A, for example, a channel region and a pair of diffusion layers 22 that configure a portion of the transistor 20 are formed on single-crystal silicon (see FIG. 13). In contrast, the semiconductor layer 10B differs from the semiconductor layer 10A in polarity, and is formed to cover both the semiconductor layer 10A and the element separating film 11. The semiconductor layer 10B includes, for example, single-crystal silicon.

Figure 13:
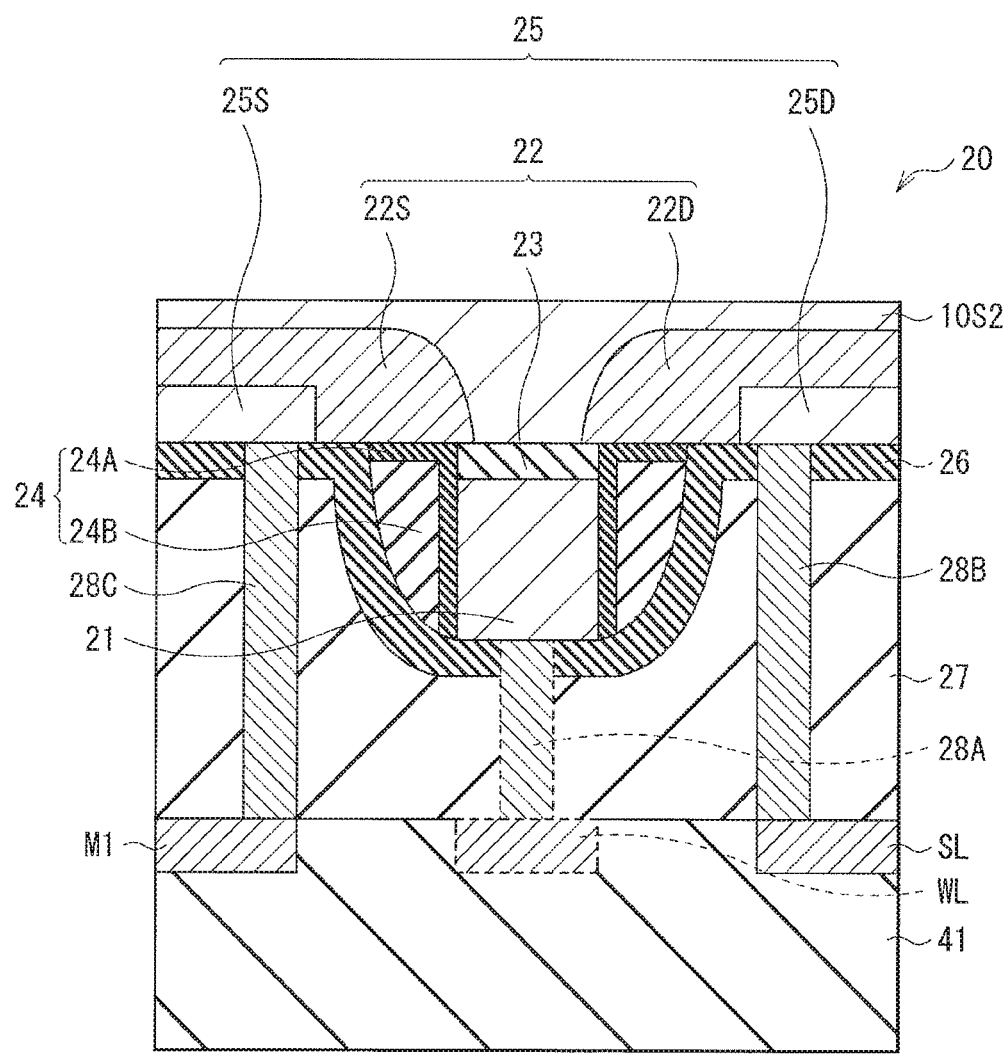
FIG. 13 is a cross-sectional view of a configuration of a transistor provided on a side on which a second substrate illustrated in FIG. 4 is located.

The transistor 20 is the Si planar transistor, and has, for example, a gate electrode 21 and a pair of the diffusion layers 22 (22S and 22D) acting as a source region and a drain region, as illustrated in FIG. 13.

The gate electrode 21 is provided on one surface of the semiconductor substrate 10. However, a gate insulating film 23 that includes a silicon oxide film, etc. is provided between the gate electrode 21 and the semiconductor substrate 10. It is to be noted that the gate insulating film 23 is greater in thickness than any of the transistors each having the three-dimensional structure such as the Fin-FET described above.

A sidewall 24 that includes, for example, a stacked film of a silicon oxide film 24A and a silicon nitride film 24B is provided on a side surface of the gate electrode 21.

A pair of the diffusion layers 22 is formed through diffusing an impurity in silicon, and configures the semiconductor layer 10A. Specifically, the pair of the diffusion layers 22 includes a diffusion layer 22S corresponding to a source region and a diffusion layer 22D corresponding to a drain region, and is provided with a channel region opposed to the gate electrode 21 in the semiconductor layer 10A interposed therebetween. Silicide regions 25 (25S and 25D) that includes, for example, a metal silicide such as NiSi (nickel silicide) or CoSi (cobalt silicide) are provided in respective portions of the diffusion layers 22 (22S and 22D). The silicide regions 25 serve to reduce a contact resistance between each of coupling sections 28A to 28C to be described later and the diffusion layer 22. One surface of the silicide region 25 is exposed on the one surface (the surface 10S1) of the semiconductor substrate 10, while an opposite surface thereof is covered with the semiconductor layer 10B. Further, each of the diffusion layer 22 and the silicide region 25 is smaller in thickness than the element separating film 11.

An unillustrated metallic film is buried in an interlayer insulating film 27. Further, the coupling sections 28A to 28D are provided to penetrate through the interlayer insulating films 26 and 27. The silicide region 25D of the diffusion layer 22D acting as the drain region and the silicide region 25S of the diffusion layer 22S acting as the source region are coupled to the metallic film M1 of a wiring line 40A to be described later through the coupling section 28B and the coupling section 28C, respectively.

The multi-layer wiring formation section 40 has a structure in which the metallic film M1, a metallic film M2, a metallic film M3, a metallic film M4, and a metallic film M5 are stacked on an interlayer insulating film 41, an interlayer insulating film 42, an interlayer insulating film 43, and an interlayer insulating film 44 that are stacked in order from a side closer to the transistor 20, for example. Here, the metallic film M1, the metallic film M2, the metallic film M3, the metallic film M4, and the metallic film M5 are buried in the interlayer insulating film 27, the interlayer insulating film 41, the interlayer insulating film 42, the interlayer insulating film 43, and the interlayer insulating film 44, respectively. Further, the metallic film M1 and the metallic film M2 are coupled to each other through a via V1 penetrating through the interlayer insulating film 41. Similarly, the metallic film M2 and the metallic film M3 are coupled to each other through a via V2 penetrating through the interlayer insulating film 42. The metallic film M3 and the metallic film M4 are coupled to each other through a via V3 penetrating through the interlayer insulating film 43. The metallic film M4 and the metallic film M5 are coupled to each other through a via V4 penetrating through the interlayer insulating film 44. As described above, the wiring line 40A is coupled to the diffusion layers 22 serving as the drain region and the source region respectively through the coupling section 28B and the coupling section 28C that are in contact with the metallic film M1 of the wiring line 40A. It is to be noted that a configuration of the multi-layer wiring formation section 40 illustrated in FIG. 4 is represented as an example, and the configuration is not limited thereto.

A surface wiring formation section 45 that is surface-bonded to the first substrate 100 is provided on the multi-layer wiring formation section 40. In the surface wiring formation section 45, a metallic film 45B that includes, for example, copper (Cu) is buried in a surface of an insulating film 45A, and the metallic film 45B is coupled to the metallic film M5 of the multi-layer wiring formation section 40 through a via V5 penetrating through the insulating film 45A.

The first substrate 100 and the second substrate 200 are electrically coupled to each other by bonding (surface-bonding) a plurality of the metallic films 45B and 65B that is buried in the surface wiring formation section 45 and the surface wiring formation section 65, as described above. It is to be noted that, as a material for the metallic films 45B and 65B, for example, aluminum (Al), gold (Au), etc. are easy to use in addition to Cu, and such metallic films are preferably formed using the same material as the material used for any of wiring lines 40A, 40B, 80A, and 80B. Bonding of the first substrate 100 and the second substrate 200 with the use of the surface bonding in such a manner allows for fine-pitch bonding and an increase in a degree of freedom of wire routing. Further, this makes it possible to dispose more transistors in a narrower region, thereby allowing for achievement of high integration.

Figure 14A:
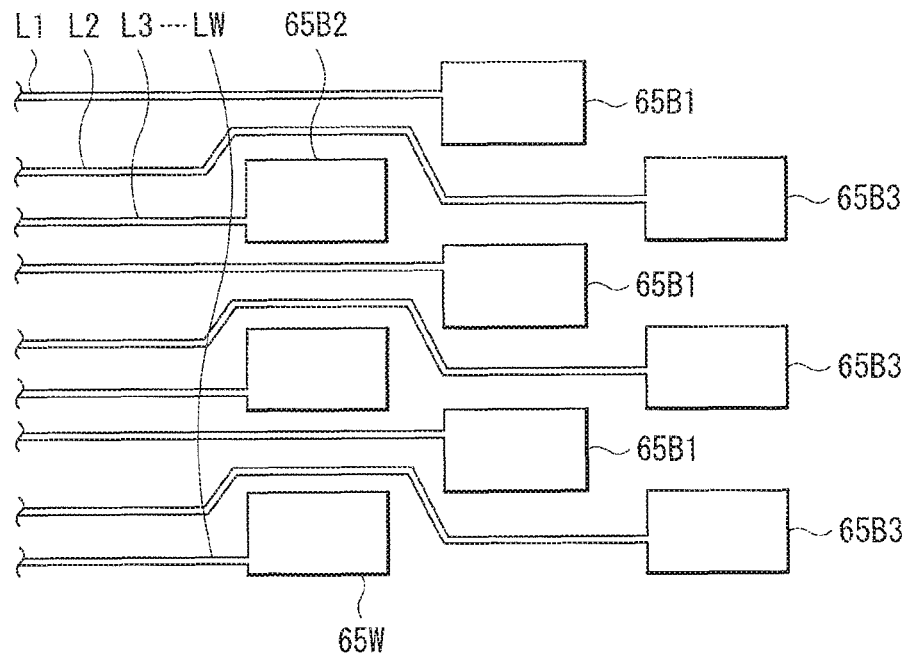
FIG. 14A is a schematic diagram illustrating an example of a wiring structure in bonding of the first substrate and the second substrate.

It is to be noted that, for a bit line, etc. taken out of the memory array from 110, a wiring width thereof is, for example, as narrow as 0.1 µm, and a wiring pitch is also fine. Therefore, in such a condition, it is difficult to electrically couple the bit line, etc. to a wiring line of the second substrate 200. In such a case, for example, as illustrated in FIG. 14A, on a surface of the insulating film 65A on the first substrate 100 side (a surface opposed to the second substrate 200), for example, each of wiring lines L1, L2, L3 . . . Ln that configure the bit line may be extended to a proper region, and expansion sections (metallic films 65B (metallic films 65B1, 65B2, 65C . . . 65Bn)) acting as junctions with a wiring line on the second substrate 200 side may be provided on ends of the extended wiring lines. At this time, the respective expansion sections (the metallic films 65B1, 65B2, 65C . . . 65Bn) of the respective wiring lines L1, L2, L3 . . . Ln are preferably disposed in a staggered arrangement, as illustrated in FIG. 14A for example.

Figure 14B:
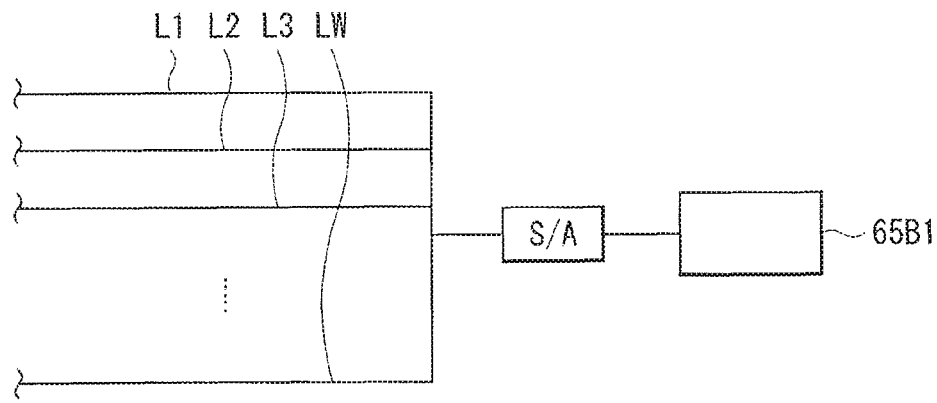
FIG. 14B is a schematic diagram illustrating another example of the wiring structure in bonding of the first substrate and the second substrate.

Alternatively, as illustrated in FIG. 14B, on a surface of the insulating film 65A on the first substrate 100 side (a surface opposed to the second substrate 200), each of the wiring lines L1, L2, L3 . . . Ln may be extended to a proper region to assemble these wiring lines in a sense amplifier (S/A), and thereafter an expansion section (the metallic film 65B (65B1)) may be formed on an end of the S/A.

Figure 15:
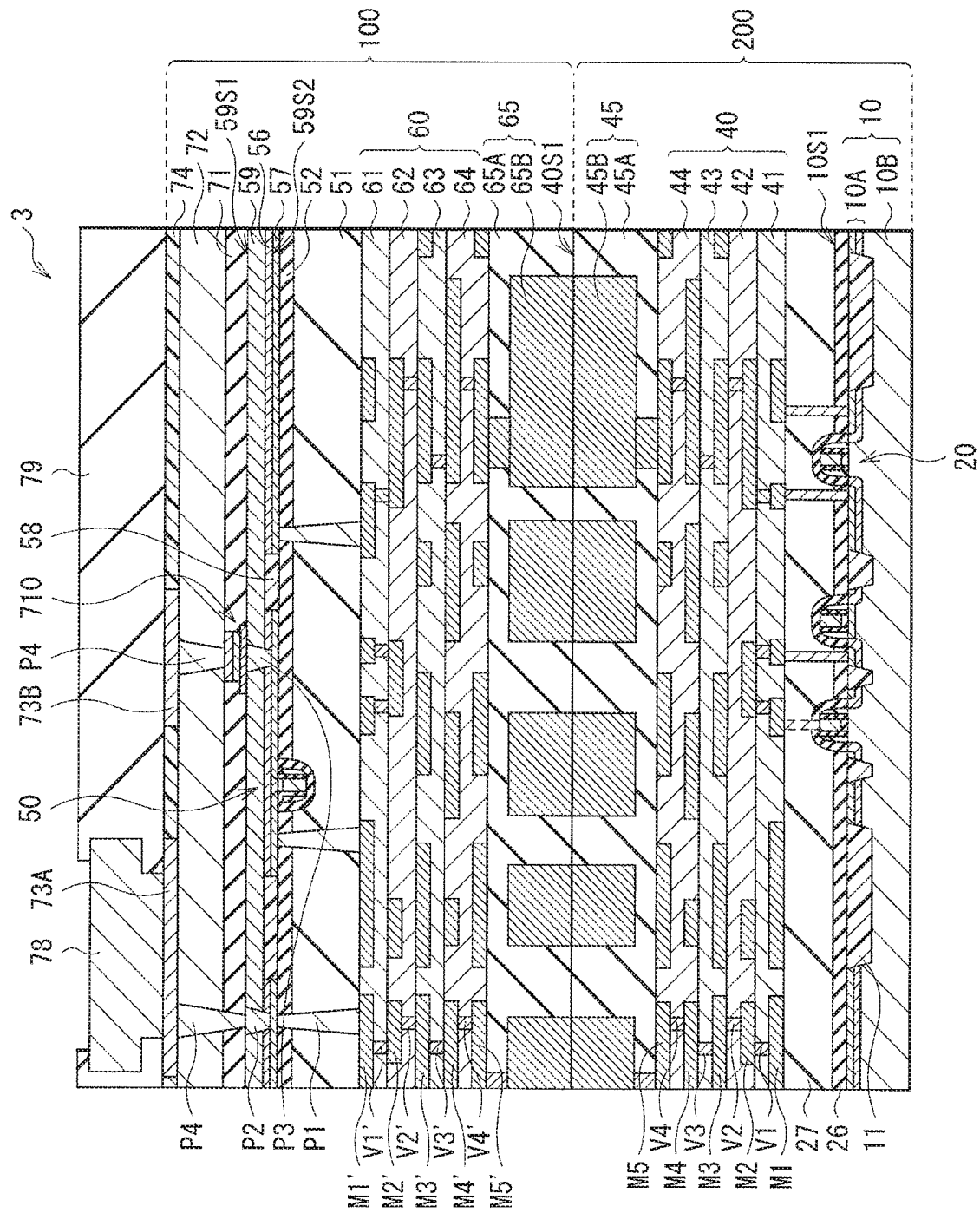
FIG. 15 is a cross-sectional view of another configuration of the semiconductor device according to the first embodiment of the present disclosure.

Further, a pad section 78 for an external terminal may be formed on wiring lines 73A and 73B and the insulating film 74 of the first substrate 100, as illustrated in FIG. 15. The pad section 78 includes, for example, Al, and an insulating film 79 is provided around the pad section 78.

(1-3. Workings and Effects)

As described above, reduction in mounting area is desired in a semiconductor device. A memory chip or a memory-functional block that is provided on a semiconductor device having a memory function is broadly divided into a memory array section and a peripheral circuit section that serves to gain access to a memory array. The peripheral circuit section occupies a larger area as compared with the memory array, which poses an impediment to reduction in mounting area.

Examples of a method of reducing a mounting area of a semiconductor device including a built-in memory array include a method of forming a memory element and a peripheral circuit including a transistor separately on a front side and a rear side of a substrate. In a case where the peripheral circuit is formed on a front surface of the substrate, and the memory element is formed on a rear surface of the substrate, to reduce an aspect ratio of a backside contact in consideration of easiness of manufacturing, the rear surface of the substrate is reduced in thickness after the peripheral circuit is formed. In a case where, for example, an FD-SOI transistor is used as a transistor configuring the peripheral circuit, if the substrate is reduced in thickness, there is a possibility that a back-bias effect used for control of a threshold voltage or a substrate effect is unavailable, resulting in nonachievement of desired operation. This is not limited to the FD-SOI transistor, and the same is true for an Si planar-type bulk transistor and a Fin-FET transistor. Further, in a case of a bipolar element of a well structure, an analog element such as a diode utilizing a well, the Si planar-type bulk transistor mounted mixedly with the Fin-FET transistor, etc., there is a possibility that the desired operation is unavailable.

In contrast, in the semiconductor device 1 of the present embodiment, the memory array 110 that includes a plurality of memory elements (the memory elements 710) and the peripheral circuit that controls operation of the memory array 110 are formed separately on the first substrate 100 and the second substrate 200. This allows for reduction in mounting area without causing failure, etc. of a transistor provided on the semiconductor device 1.

Further, in the present embodiment, the transistor (the transistor 50) that configures the memory array 110, and a select line of a word line is only formed on the first substrate 100. In addition, in the present embodiment, the transistor 50 configuring the memory array 110 includes a one-sided channel such as an nFET or a pFET. This makes it possible for the NVM 120 formed on the surface S2 side of the first substrate 100 to significantly reduce manufacturing processes thereof as compared with a case of manufacturing a typical CMOS. Further, inexpensive manufacturing is also achievable.

Next, description is provided on second to fourth embodiments, and modification examples 1 and 2. It is to be noted that component parts corresponding to those of the semiconductor devices 1 to 3 of the above-described first embodiment are denoted by the same reference numerals for description.

2. Second Embodiment

Figure 16:
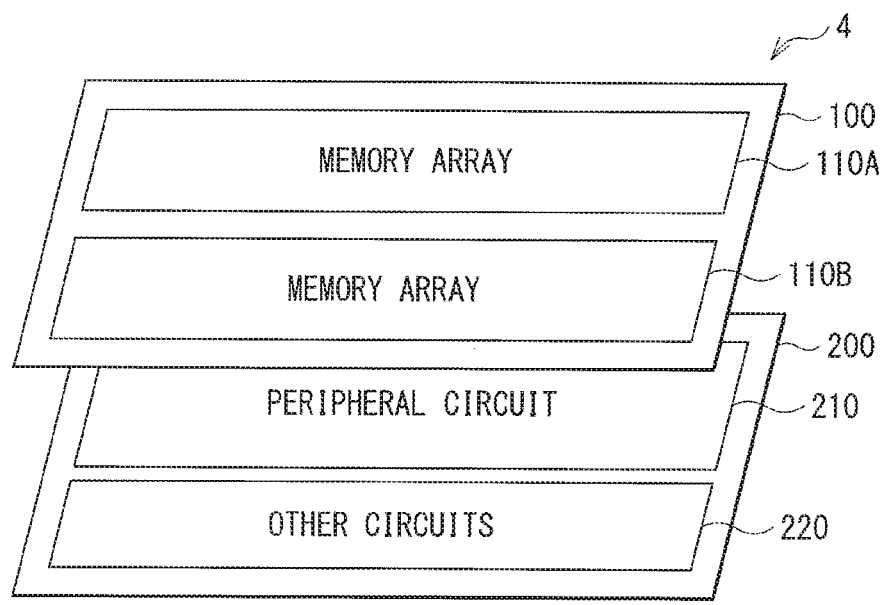
FIG. 16 is a schematic view of a semiconductor device according to a second embodiment of the present disclosure.

FIG. 16 illustrates a schematic configuration of a semiconductor device 4 as a second embodiment of the present disclosure. The semiconductor device 4 of the present embodiment has a configuration in which a plurality of (here, two) memory arrays (memory arrays 110A and 110B) are formed on the first substrate 100. On the second substrate 200, one peripheral circuit 210 is provided as with the above-described first embodiment, and other circuits 220 are formed additionally.

As described above, the mounting area of the peripheral circuit 210 is greater than that of the memory array 110. Therefore, in a case where the memory array 110 and the peripheral circuit 210 are formed separately on the first substrate 100 and the second substrate 200, an empty area is created on the first substrate 100 on which the memory array 110 is formed. As with the present embodiment, this makes it possible to mount, for example, two memory arrays 110A and 110B on the first substrate 100. On the second substrate 200, however, a logic circuit block and an analog circuit that configure a functional circuit are typically mounted as the other circuits 220 in addition to the peripheral circuit 210, which makes it difficult to mount a peripheral circuit corresponding to each of the memory arrays 110A and 110B.

Figure 17:
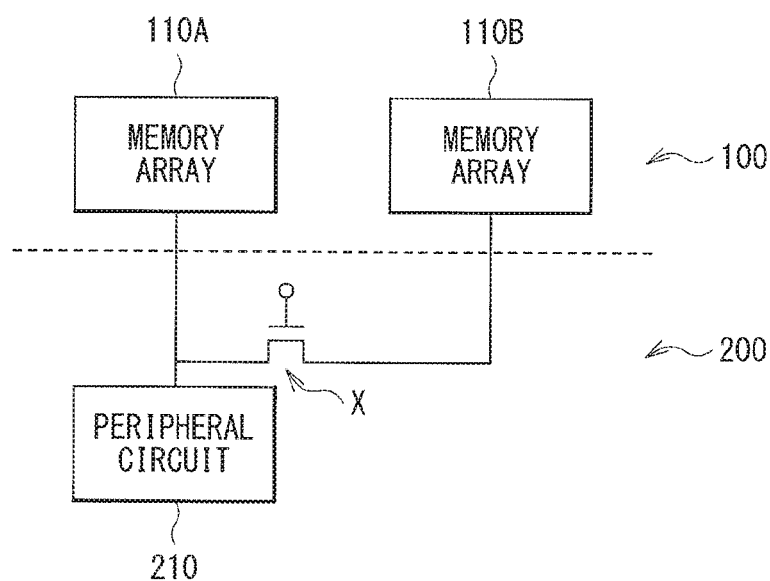
FIG. 17 is a schematic diagram illustrating a relationship between two memory arrays and a peripheral circuit in the semiconductor device illustrated in FIG. 16.

In contrast, in the present embodiment, as illustrated in FIG. 17, use of a switch element X makes it possible to perform control through switching the two memory arrays 110A and 110B like, for example, Power Gate (registered trademark) using the one peripheral circuit 210. Further, each of the memory arrays is divided into a plurality of blocks, and, for example, a switch transistor is disposed as the switch element X in each of the blocks, which makes it possible to control each of the blocks independently. Such a configuration makes it possible to mainly use one (for example, the memory array 110A) of the memory arrays, while using the other memory array (for example, the memory array 110B) as a backup memory array in case of occurrence of a failure of the memory array 110A, for example.

It is to be noted that the switch element X may be provided on the second substrate 200, or may be provided on the first substrate 100. Alternatively, the switch elements X may be provided on both the first substrate 100 and the second substrate 200. Further, in a case where a plurality of the memory arrays 110A and 110B is controlled by the one peripheral circuit 210 as described above, the peripheral circuit 210 is preferably disposed at a midpoint position between the memory arrays 110A and 110B to avoid a difference in wiring length. Specifically, for example, a sense amplifier (S/A) provided in the peripheral circuit 210 and each of memory arrays (here, the two memory arrays 110A and 110B) are preferably disposed at an equal distance from. This allows for operation of a plurality of memory arrays by the use of a single peripheral circuit without causing clock delay among the respective memory arrays, or the like.

As described above, in the present embodiment, a plurality of memory arrays (the memory arrays 110A and 110B) is mounted on the first substrate 100, and each of the memory arrays 110A and 110B is controllable by the one peripheral circuit 210 provided on the second substrate 200. This allows for an increase in mourning capacity of the memory array 110 in the semiconductor device 4. Further, use of the switch element X makes it possible to control each of the memory arrays 110A and 110B independently by the one peripheral circuit 210. For example, in case of occurrence of a failure of one memory array, this allows another memory array to be used as a standby memory array.

3. Third Embodiment

Figure 18:
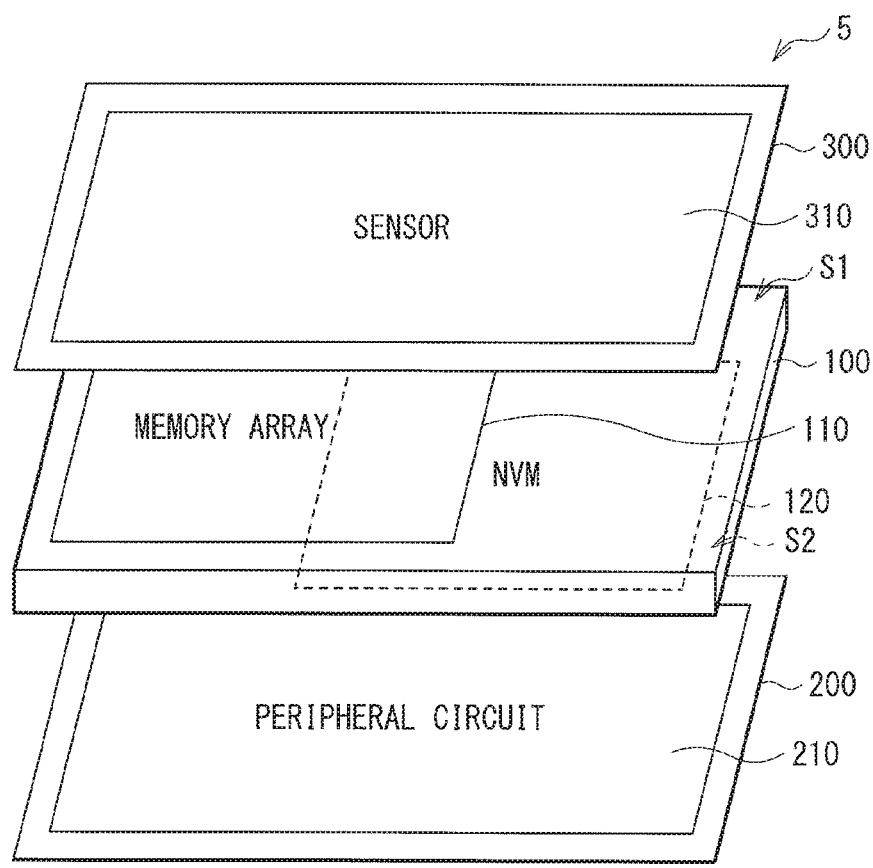
FIG. 18 is a schematic view of a semiconductor device according to a third embodiment of the present disclosure.

FIG. 18 illustrates a schematic configuration of a semiconductor device 5 as a third embodiment of the present disclosure. The semiconductor device 5 of the present embodiment has a configuration in which a third substrate 300 having a sensor 310 is further stacked on the first substrate 100 in a structure where the second substrate 200 on which the peripheral circuit 210 is provided, and the first substrate 100 on which the memory array 110 is provided are stacked in this order. In the present embodiment, a case where an image sensor (an imaging element 30) is mounted is described as an example of the sensor 310.

Figure 19:
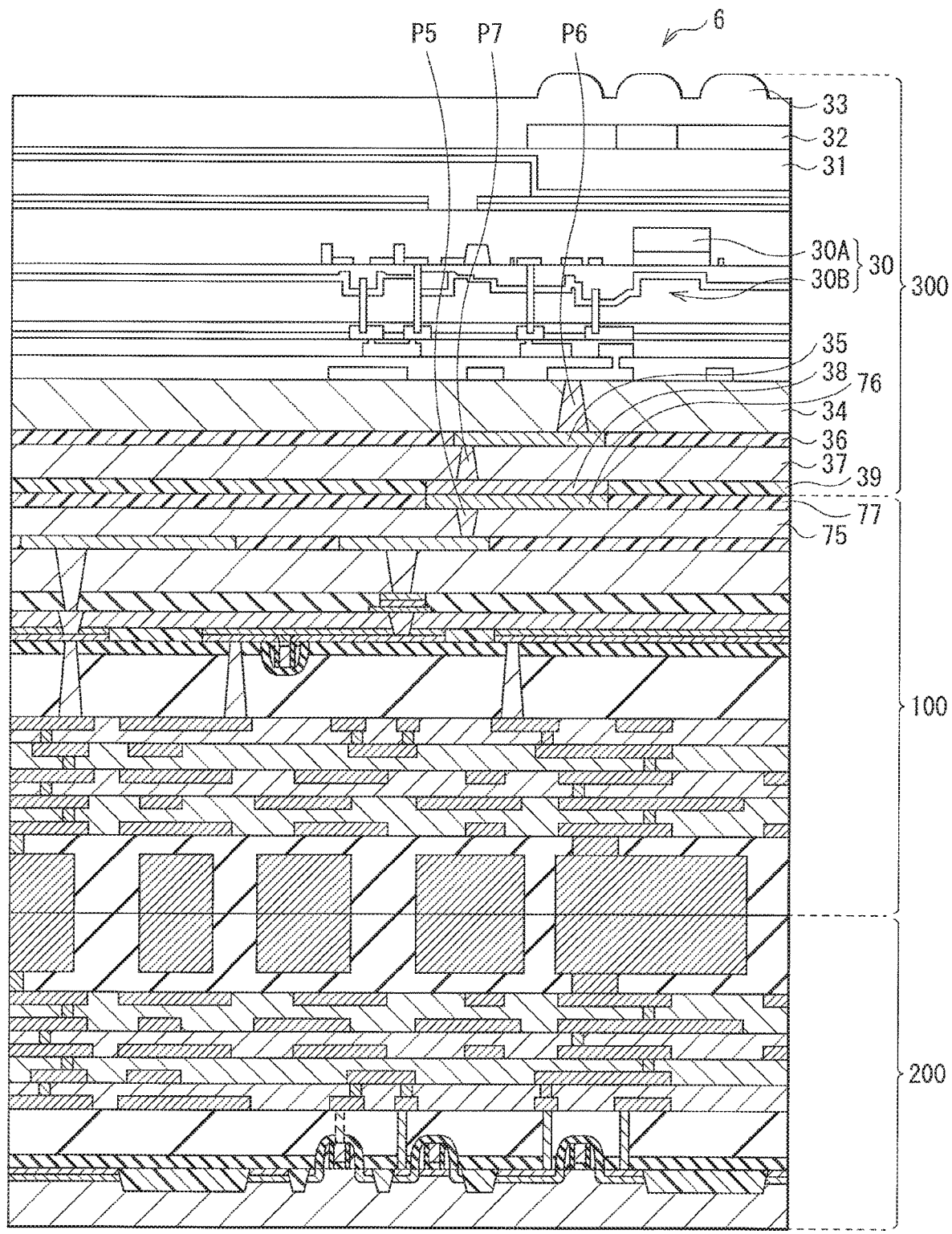
FIG. 19 is a cross-sectional view of a configuration of the semiconductor device illustrated in FIG. 18.

FIG. 19 illustrates an example of a cross-sectional configuration of a specific semiconductor device (a semiconductor device 6) in the present embodiment.

The third substrate 300 having the imaging element 30 has a configuration in which, for example, a planarizing layer 31, a color filter 32, and a microlens 33 are provided in this order on a semiconductor substrate in which, for example, a photodiode 30A, a transistor 30B, etc. are buried. Further, the third substrate 300 is provided with a conductive film 35 with an insulating layer 34 including, for example, Cu interposed therebetween in a bottom layer thereof (on the first substrate 100 side), and an insulating film 36 is provided around the conductive film 35. The conductive film 35 is formed, and the insulating film 36 is provided around the conductive film 35. A conductive film 38 that is bonded to the first substrate 100 with an insulating layer 37 interposed therebetween is provided on the conductive film 35 and the insulating film 36, and an insulating film 39 is provided around the conductive film 38. The first substrate 100 and the third substrate 300 are coupled electrically through bonding the conductive film 38 and a conductive film 76 on the first substrate side to each other.

As described above, stacking the third substrate 300 including the sensor 310 that has the imaging element 30 on the semiconductor device 1 described in the above first embodiment makes it possible to provide an image sensor that incorporates a high-capacity memory ensuring high-speed data exchange and reduction in power consumption.

It is to be noted that, in the present embodiment, the description is provided with reference to the imaging element 30 as an example of the sensor; however, the sensor is not limited thereto. For example, a variety of sensor elements such as a temperature sensor, a gravity sensor, a positional sensor may be provided.

4. Fourth Embodiment

Figure 20:
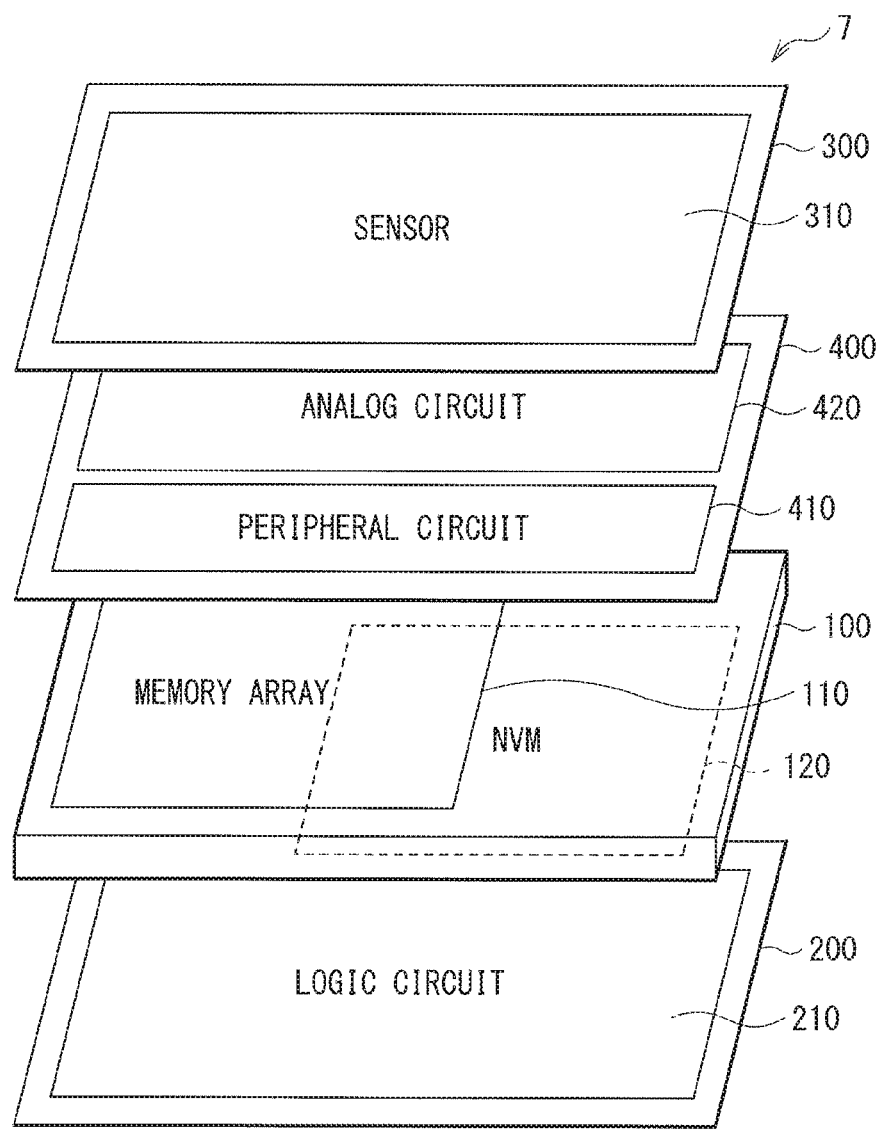
FIG. 20 is a schematic view of a semiconductor device according to a fourth embodiment of the present disclosure.

FIG. 20 illustrates a schematic configuration of a semiconductor device 7 as a fourth embodiment of the present disclosure. The semiconductor device 7 of the present embodiment has a configuration in which a fourth substrate 400 on which a peripheral circuit 410 and an analog circuit 420 are provided is added between the first substrate 100 and the third substrate 300 of the semiconductor device 6 described in the above third embodiment. Examples of the peripheral circuit 410 and the analog circuit 420 that are provided on the fourth substrate 400 include a peripheral circuit and an analog circuit of the sensor 310 provided on the third substrate 300.

As described above, disposing the peripheral circuit (the peripheral circuit 410) and the analog circuit (the analog circuit 420) of the sensor 310 on another substrate (the fourth substrate 400) makes it possible to provide a sensor including more analog circuits. Further, configuring the sensor on two substrates (the third substrate 300 and the fourth substrate 400) makes it possible to manufacture circuits including different-generation transistors separately from one another, thereby allowing for reduction in manufacturing costs.

5. Modification Example 1

Figure 21:
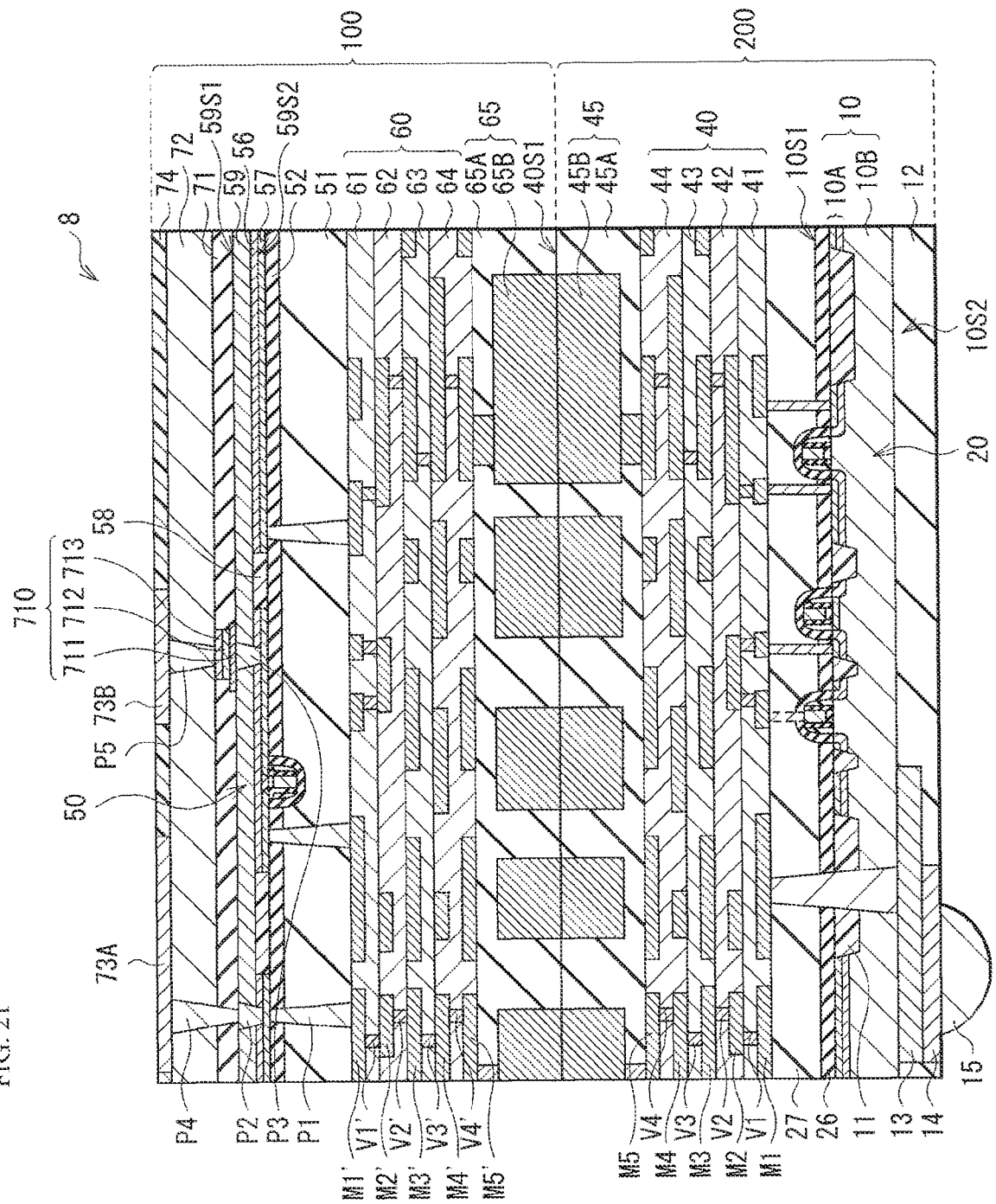
FIG. 21 is a cross-sectional view of a configuration of a semiconductor device according to a modification example 1 of the present disclosure.

FIG. 21 illustrates a cross-sectional configuration of a semiconductor device 8 as a modification example (a modification example 1) of the present disclosure. The present modification example is different from the above-described first embodiment in that an extraction electrode 15 is provided on the surface S2 side of the second substrate 200.

The extraction electrode 15 is provided on another surface (on the surface 10S2) of the semiconductor substrate 10 with an insulating layer 12 including, for example, an $SiO_2$ film interposed therebetween. In the insulating layer 12, a conductive film 13 including, for example, Cu and a conductive film 14 including, for example, Al are formed in this order. The extraction electrode 15 is electrically coupled to the metallic film M1 through the conductive films 13 and 14, and the contact plug P8 penetrating through the semiconductor substrate 10, the element separating film 11, and the interlayer insulating films 26 and 27.

Thus, providing the extraction electrode 15 as described above makes it possible to form an electrode extracting port at any position.

6. Modification Example 2

Figure 22:
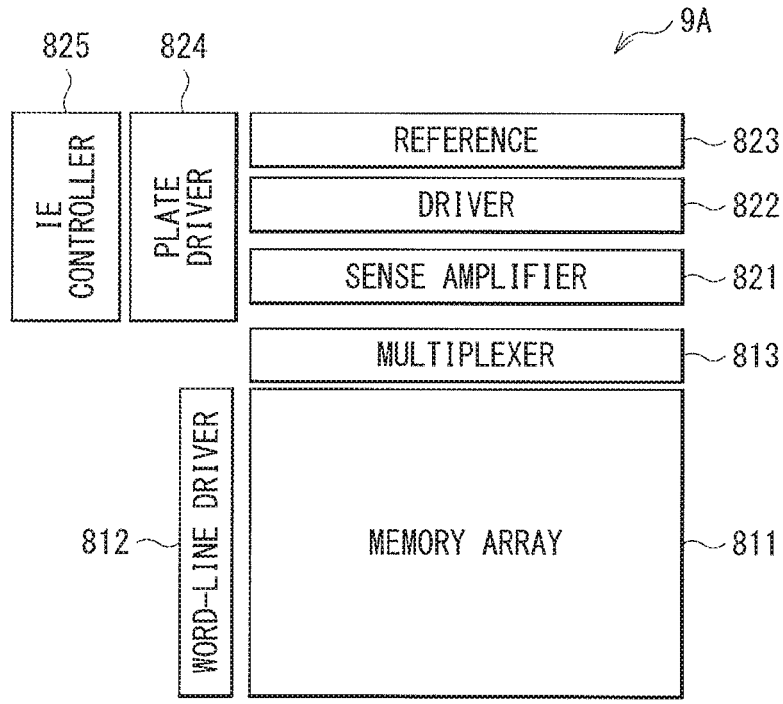
FIG. 22 is a block diagram illustrating an example of a configuration of a semiconductor device according to a modification example 2 of the present disclosure.
Figure 23:
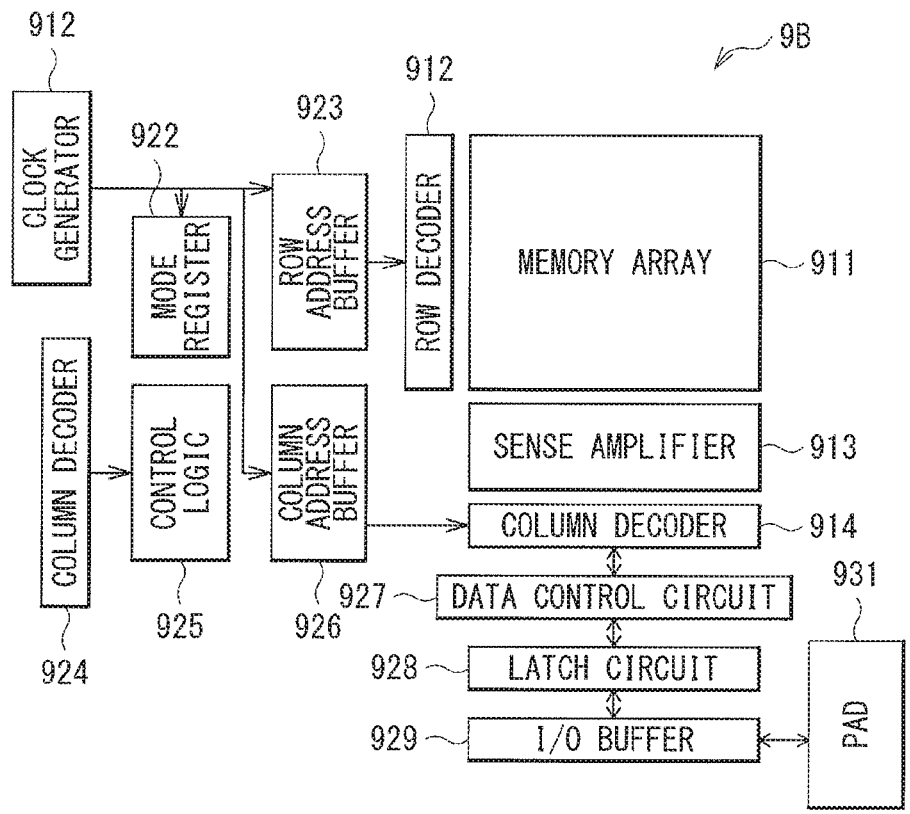
FIG. 23 is a block diagram illustrating another example of the configuration of the semiconductor device according to the modification example 2 of the present disclosure.

It is possible for the semiconductor device of the present disclosure to include, as a memory element mounted on the first substrate 100, a memory element other than the MTJ element described in the above-described first embodiment. FIG. 22 illustrates, as a block diagram, an example of a specific configuration of a semiconductor device (a semiconductor device 9A) including a memory element other than the MTJ as a modification example (a modification example 2) of the present disclosure. FIG. 23 illustrates, as a block diagram, another example of a specific configuration of a semiconductor device (a semiconductor device 9B) as the modification example (the modification example 2) of the present disclosure.

The semiconductor device 9A uses a resistance variable element (ReRAM) as a memory element other than the MTJ. The semiconductor device 9A includes, for example, a memory array 811, a word-line driver 812, a multiplexer 813, a sense amplifier 821, a driver 822, a reference 823, a plate driver 824, and an interface controller 825. Among those, the memory array 811, the word-line driver 812, and the multiplexer 813 are preferably provided on the first substrate 100. The sense amplifier 821, the driver 822, the reference 823, the plate driver 824, and the interface controller 825 are preferably provided on the second substrate 200.

The semiconductor device 9B uses a DRAM as a memory element other than the MTJ element. The DRAM is a capacitative element that stores information through storing charges on a capacitor, and is a kind of so-called volatile memory element in which stored information is lost in absence of power supply. The semiconductor device 9B includes, for example, a memory array 911, a row decoder 912, a sense amplifier 913, a column decoder 914, a clock generator 921, a mode register 922, a row address buffer 923, a column decoder 924, a column logic 925, a column address buffer 926, a data control circuit 927, a latch circuit 928, an I/O buffer 929, and a pad 931. Among those, the memory array 911, the row decoder 912, the sense amplifier 913, and the column decoder 914 are preferably provided on the first substrate 100. The clock generator 921, the mode register 922, the row address buffer 923, the column decoder 924, the column logic 925, the column address buffer 926, the data control circuit 927, the latch circuit 928, the I/O buffer 929, and the pad 931 are preferably provided on the second substrate 200.

The present disclosure is described thus far with reference to the first to fourth embodiments, and the modification examples 1 and 2; however, the present disclosure is not limited to the above-described embodiments, etc., and may be modified in a variety of ways. For example, in the above-described embodiments, etc., specific configurations of the transistors 20 and 50, and the memory element 710 have been described; however, it is not necessary to include all component parts, and any other component part may be further provided.

It is to be noted that the effects described herein are merely illustrative and non-limiting, and other effects may be included. Further, the present technology may be configured as follows.

It is to be noted that the semiconductor device and a projection display apparatus may have the following configurations.

(1)
A semiconductor device including:
a first substrate provided with a memory array; and
a second substrate that is stacked with the first substrate, and is provided with a peripheral circuit that controls operation of the memory array (2)
The semiconductor device according to (1), in which the second substrate is provided with a logic circuit and an analog circuit.

(3)
The semiconductor device according to (1) or (2), in which
the first substrate has a core substrate,
the memory array includes a plurality of memory cells each including a memory element and a cell transistor,
the cell transistor is provided on one surface of the core substrate, and
the memory element is formed on another surface opposed to the one surface of the core substrate.

(4)
The semiconductor device according to (3), in which the memory element is electrically coupled to a source region or a drain region of the cell transistor through a contact penetrating through the core substrate.

(5)
The semiconductor device according to (3) or (4), in which the merry element includes a magnetoresistive element, a resistance variable element, or a volatile element.

(6)
The semiconductor device according to any one of (3) to (5), in which the cell transistor includes an nFET or a pFET.

(7)
The semiconductor device according to any one of (1) to (6), including a plurality of transistors that are different in supply voltage from one another, in which
a first transistor having a low supply voltage of the plurality of transistors is provided on the first substrate of the first substrate and the second substrate.

(8)
The semiconductor device according to (7), in which the first transistor includes an FD-SOI transistor, a Fin-FET, a Tri-Gate transistor, and a Nano-Wire transistor.

(9)
The semiconductor device according to any one of (1) to (8), including a plurality of transistors that are different in supply voltage from one another;
a second transistor having the highest supply voltage of the plurality of transistors is provided on the second substrate of the first substrate and the second substrate.

(10)
The semiconductor device according to any one of (1) to (9), in which
the first substrate has a plurality of memory arrays, and
the plurality of memory arrays is controlled by one peripheral circuit provided on the second substrate.

(11)
The semiconductor device according to (10), in which the first substrate, the second substrate, or both have one or a plurality of switch elements, and switching of the plurality of memory arrays controlled by the one peripheral circuit is performed by the one or the plurality of switch elements.

(12)
The semiconductor device according to (10) or (11), in which the one peripheral circuit that controls operation of the plurality of memory arrays is disposed at an equal distance relative to the plurality of memory arrays.

(13)
The semiconductor device according to any one of (10) to (12), in which each of the plurality of memory arrays is disposed at an equal distance to a sense amplifier provided in the one peripheral circuit.

(14)
The semiconductor device according to any one of (1) to (13), including a third substrate that is stacked with the first substrate and the second substrate, and is provided with a sensor element.

(15)
The semiconductor device according to (14), including a fourth substrate that is provided with a peripheral circuit that controls operation of the sensor element, and an analog element for the sensor element.

(16)
The semiconductor device according to any one of (3) to (15), in which a film including a material allowing for control of a work function of a semiconductor material is formed on the other surface of the core substrate.

(17)
The semiconductor device according to any one of (1) to (16), in which the second substrate is provided with an external electrode on a surface opposite to a surface on which the peripheral circuit is formed.

(18)
The semiconductor device according to any one of (1) to (17), in which the first substrate has, on a surface bonded to the second substrate, an expansion section on each of ends of a plurality of wiring lines taken out of the memory array.

(19)
The semiconductor device according to (18), in which a plurality of the expansion sections provided on ends of a plurality of the wiring lines is disposed in a staggered arrangement.

This application claims the priority on the basis of Japanese Patent Application No. 2017-008899 filed on Jan. 20, 2017 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A semiconductor device, comprising:
a first substrate provided with a memory array; and
a second substrate that is stacked with the first substrate and that is provided with a peripheral circuit that controls operation of the memory array,
wherein the first substrate has a core substrate,
wherein the memory array includes a plurality of memory cells each including a memory element and a cell transistor,
wherein the cell transistor is provided on one surface of the core substrate, and
wherein the memory element is formed on another surface opposed to the one surface of the core substrate.

2. The semiconductor device according to claim 1, wherein the second substrate is provided with a logic circuit and an analog circuit.

3. The semiconductor device according to claim 1, wherein the memory element is electrically coupled to a source region or a drain region of the cell transistor through a contact penetrating through the core substrate.

4. The semiconductor device according to claim 1, wherein the memory element comprises a magnetoresistive element, a resistance variable element, or a volatile element.

5. The semiconductor device according to claim 1, wherein the cell transistor includes an nFET or a pFET.

6. A semiconductor device, comprising:
a first substrate provided with a memory array;
a second substrate that is stacked below the first substrate and that is provided with a peripheral circuit that controls operation of the memory array; and
a plurality of transistors that are different in supply voltage from one another, wherein
a first transistor having a low supply voltage of the plurality of transistors is provided on the first substrate.

7. The semiconductor device according to claim 6, wherein the first transistor comprises an FD-SOI transistor, a Fin-FET, a Tri-Gate transistor, and a Nano-Wire transistor.

8. A semiconductor device, comprising:
a first substrate provided with a memory array;
a second substrate that is stacked below the first substrate and that is provided with a peripheral circuit that controls operation of the memory array;
a plurality of transistors that are different in supply voltage from one another; and
a first transistor having a highest supply voltage of the plurality of transistors is provided on the second substrate.

9. The semiconductor device according to claim 1, wherein the first substrate has a plurality of memory arrays, and
wherein the plurality of memory arrays is controlled by one peripheral circuit provided on the second substrate.

10. The semiconductor device according to claim 9, wherein the first substrate, the second substrate, or both have one or a plurality of switch elements, and
wherein switching of the plurality of memory arrays controlled by the one peripheral circuit is performed by the one or the plurality of switch elements.

11. The semiconductor device according to claim 9, wherein the one peripheral circuit that controls operation of the plurality of memory arrays is disposed at an equal distance between the plurality of memory arrays.

12. The semiconductor device according to claim 9, wherein each of the plurality of memory arrays is disposed at an equal distance to a sense amplifier provided in the one peripheral circuit.

13. A semiconductor device, comprising:
a first substrate provided with a memory array;
a second substrate that is stacked below the first substrate and that is provided with a peripheral circuit that controls operation of the memory array;
a third substrate that is stacked with the first substrate and the second substrate and that is provided with a sensor element; and
a fourth substrate provided between the third substrate and the first substrate including a peripheral circuit that controls operation of the sensor element and analog element for the sensor element.

14. The semiconductor device according to claim 1, wherein a film including a material allowing for control of a work function of a semiconductor material is formed on the another surface of the core substrate.

15. The semiconductor device according to claim 1, wherein the second substrate is provided with an external electrode on a surface opposite to a surface on which the peripheral circuit is formed.

16. A semiconductor device, comprising:
a first substrate provided with a memory array; and
a second substrate that is stacked with the first substrate and that is provided with a peripheral circuit that controls operation of the memory array, wherein the first substrate has, on a surface bonded to the second substrate, an expansion section on each of ends of a plurality of wiring lines taken out of the memory array and
wherein a plurality of the expansion sections provided on the ends of the plurality of wiring lines is disposed in a staggered arrangement.

17. The semiconductor device according to claim 6, wherein the second substrate is provided with a logic circuit and an analog circuit.

18. The semiconductor device according to claim 8, wherein the second substrate is provided with a logic circuit and an analog circuit.

19. The semiconductor device according to claim 6, wherein first transistor includes a transistor employing a high-dielectric film.

20. The semiconductor device according to claim 8, wherein first transistor includes a planar transistor.

* * * * *